United States Patent [19]

Ishikawa et al.

[11] Patent Number: 4,977,057
[45] Date of Patent: Dec. 11, 1990

[54] IMAGE-FORMING METHOD USING SILVER HALIDE AND POLYMERIZABLE COMPOUND

[75] Inventors: Shunichi Ishikawa; Koichi Nakamura, both of Kanagawa, Japan

[73] Assignee: Fuji Photo Film Co., Ltd., Kanagawa, Japan

[21] Appl. No.: 328,983

[22] Filed: Mar. 27, 1989

[30] Foreign Application Priority Data

Jul. 27, 1988 [JP] Japan ................................ 63-187803
Jan. 9, 1989 [JP] Japan ...................................... 1-3282

[51] Int. Cl.$^5$ ............................ G03C 5/54; G03F 7/26
[52] U.S. Cl. ..................................... 430/138; 430/203; 430/254; 430/264; 430/327; 430/330
[58] Field of Search ............... 430/138, 203, 330, 327, 430/253, 254, 264

[56] References Cited

U.S. PATENT DOCUMENTS

| 3,723,120 | 3/1973 | Hummel | 430/327 |
| 4,629,676 | 12/1986 | Hayakawa et al. | 430/203 |
| 4,876,170 | 10/1989 | Tamagawa et al. | 430/138 |

*Primary Examiner*—Richard L. Schilling
*Attorney, Agent, or Firm*—Sughrue, Mion, Zinn, Macpeak & Seas

[57] ABSTRACT

An image-forming method comprises: imagewise exposing to light a light-sensitive material comprising a support and a light-sensitive layer which contains silver halide, a reducing agent and an ethylenic unsaturated polymerizable compound; and simultaneously or thereafter developing the light-sensitive material to imagewise polymerize the polymerizable compound. The light-sensitive material is developed by heating the light-sensitive material at a temperature of not lower than 50° C. under such a condition that the light-sensitive layer contains a liquid in an amount of 10 to 400 wt. % based on the amount of the polymerizable compound.

8 Claims, No Drawings

IMAGE-FORMING METHOD USING SILVER HALIDE AND POLYMERIZABLE COMPOUND

FIELD OF THE INVENTION

The present invention relates to an image-forming method using a light-sensitive material which comprises a support and a light-sensitive layer containing silver halide, a reducing agent and a polymerizable compound.

BACKGROUND OF THE INVENTION

A light-sensitive material which comprises a support and a light-sensitive layer containing silver halide, a reducing agent and a polymerizable compound is employed in an image-forming method which comprises imagewise exposing the light-sensitive material and simultaneously or thereafter developing the light-sensitive material to imagewise polymerize the polymerizable compound.

The development process of the light-sensitive material in the image-forming method includes a wet development process which employs a developing solution and a heat development process (dry process) which is conducted under conditions substantially not containing water.

Examples of the image-forming method using the wet developing process of wet type are described in Japanese Patent Publication Nos. 45(1970)-11149 (corresponding to U.S. Pat. No. 3,697,275), 47(1972)-20741 (corresponding to U.S. Pat. No. 3,687,667) and 49(1974)-10697, and Japanese Patent Provisional Publication Nos. 57(1982)-138632 and 58(1983)-169143. Those image-forming methods described require a development process using a large amount of a developing solution. The process further requires a relatively long time for the operation.

Examples of the image-forming method using the heat developing process are described in Japanese Patent Provisional Publications Nos. 61(1986)-69062, 61(1986)-73145 (the content of both publications are described in U.S. Pat. No. 4,629,676 and European Patent Provisional Publication No. 0174634A2) and 62(1987)-70836. Those image-forming methods using the heat development process can easily and rapidly give a clear image without producing waste liquid of the developing solution.

Japanese Patent Provisional Publication No. 62(1986)-73145 further discloses an image-forming method in which the heat development process is carried out under such a condition that the amount of oxygen contained in the light-sensitive layer of the light-sensitive material is restrained. Oxygen serves as a polymerization inhibitor, so that the elimination of the influences of oxygen makes it possible to form an image with high sensitivity. The above-mentioned publication also discloses concrete methods for restraining the amount of oxygen contained in the light-sensitive layer. One is a method wherein a heat developing process is carried out in a gas having an oxygen content which is lower than that in the air (e.g., nitrogen). Another is a method of using an oxygen-impermeable cover. Otherwise, Japanese Patent Provisional Publication No. 62(1987)-209443 discloses a light-sensitive material containing a compound having two or more mercapto groups which restrains the amount of oxygen contained in the light-sensitive layer.

SUMMARY OF THE INVENTION

The present inventors have further studied on the method for restraining the amount of oxygen in the light-sensitive layer.

An object of the present invention is to provide an image-forming method in which the influences of oxygen on the polymerization reaction in the heat developing process can be efficiently eliminated or reduced by means of simple and easy operation.

There is provided by the present invention an image-forming method which comprises:

imagewise exposing to light a light-sensitive material comprising a support and a light-sensitive layer which contains silver halide, a reducing agent and an ethylenic unsaturated polymerizable compound; and simultaneously or thereafter heating the exposed light-sensitive material at a temperature of not lower than 50° C. under such condition that the light-sensitive layer contains a liquid in an amount of 10 to 400 wt.% based on the amount of the polymerizable compound, to imagewise polymerize the polymerizable compound.

According to the studies of the present inventors, the influence of oxygen on the polymerization reaction can be almost completely prevented by introducing a liquid into the light-sensitive layer in an amount of not smaller than 10 wt.% based on the amount of the polymerizable compound. The introduction of the liquid into the light-sensitive layer of the light-sensitive material can be made by simple and easy operation.

The method of the invention is extremely superior to the methods described in the aforementioned Japanese Patent Provisional Publication Nos. 62(1987)-210461 and 62(1987)-209443 from the viewpoints of the effect of elimination of oxygen-influences and the simple and easy operation.

Accordingly, a clear image can be obtained in the image-forming method of the invention by means of simple and easy operation.

Further, since the influences of oxygen can be eliminated in the method of the invention, the polymerization reaction can be accelerated. Therefore, an improved clear image can be obtained, even if the light-sensitive material is developed at a relatively low temperature (such as 50° to 100° C.).

If the amount of the liquid contained in the light-sensitive layer exceeds 400 wt.% based on the amount of the polymerizable compound, an additional procedure for removing the liquid (e.g., drying procedure) is needed after the heating process (that is, development process). The object of the present invention is to provide an image-forming method using simple and easy opration, so that the amount of the liquid contained in the light-sensitive layer is defined to be not more than 400 wt.% based on the amount of the polymerizable compound.

DETAILED DESCRIPTION OF THE INVENTION

The image-forming method of the present invention is characterized in that the light-sensitive material is developed by heating the light-sensitive material at a temperature of not lower than 50° C. under such condition that the light-sensitive layer contains a liquid in an amount of 10 to 400 wt.% based on the amount of the polymerizable compound.

There is no specific limitation on the liquid to be contained in the light-sensitive layer, and any liquid can be employed, provided that the liquid does not inhibit the developing reaction of the light-sensitive material (i.e., reduction of the silver halide and polymerization of the polymerizable compound).

When the polymerizable compound is liquid, the above-mentioned liquid preferably is not miscible with the polymerizable compound. When the polymerizable compound is solid, the above-mentioned liquid preferably is a liquid which does not dissolve the polymerizable compound.

In the case that the polymerizable compound is hydrophobic, water or a hydrophilic liquid is preferably employed as the liquid. In this case, it is further preferred that the liquid such as water or a hydrophilic liquid is intorduced into the light-sensitive layer by adding a hydrophilic binder to the light-sensitive layer and allowing the hydrophilic binder to absorb the liquid. When the hydrophobic polymerizable compound is used in combination with water (or hydrophilic liquid) and a hydrophilic binder as described above, the polymerizable compound is preferably contained in microcapsules having hydrophobic shell material.

The term "liquid" used in the invention means a material which is present in the form of a liquid phase at the lowest temperature required for the heat development (generally, 50° C.). Concretely, the liquid has a melting point of not higher than 50° C. and a boiling point of not lower than 50° C., (preferably 50° to 200° C.).

From the above-mentioned viewpoints, examples of the liquids preferably employable in the image-forming method of the invention include water and hydrophilic liquids such as ethylene glycol, dimethylformamide (DMF), diisobutyl ketone and methyl cellosolve. Water is most preferred. To the water can be added other materials such as an agent which participates in the development process.

The liquid may be introduced into the light-sensitive layer before or simultaneously with the imagewise exposure. Otherwise, the introduction thereof may be carried out between the imagewise exposure and the development process or simultaneously with the development process. Preferably, the liquid is introduced into the light-sensitive layer after the imagewise exposure and prior to the development process. In other words, it is preferred that the light-sensitive material is imagewise exposed, the liquid is introduced into the light-sensitive layer, and the light-sensitive material is developed in the order.

For introducing the liquid into the light-sensitive layer, there can be employed various methods such as a method of coating the liquid on the light-sensitive layer, a method of spraying the liquid on the light-sensitive layer, a method of immersing the light-sensitive layer in the liquid and a method of pressing the light-sensitive layer on another sheet containing the liquid. Most preferred is a coating method. The amount of the liquid contained in the light-sensitive layer is in the range of 10 to 400 wt. % based on the amount of the polymerizable compound as described above. The amount is preferably in the range of 20 to 200 wt. % based on the amount of the polymerizable compound.

In the case of using water as the liquid, the amount of water contained in the light-sensitive layer is preferably kept in the range of 1 to 100% of the weight of water corresponding to the maximum swelling volume of all of the coated layers on the light-sensitive layer side. Further, the water content is preferably in the range of 0.1 to 30 g, more preferably 1 to 20 g, per 1 $m^2$ of the surface area of the light-senstive material.

As the heating method in the heat development process, there can be employed various known methods. A heating layer may be provided within the light-sensitive material as a heating means as described in Japanese Patent Provisional Publication No. 61(1986)-294434.

The light-sensitive material is heated at a temperature of not less than 50° C. in the image-forming method of the invention. The temperature is preferably in the range of 50° to 150° C., more preferably 50° to 100° C., and most preferably 60° to 100° C. The heating t generally in the range of 1 second to 5 minutes, preferably 5 to 30 seconds.

The development process can be performed simultaneously with or immediately after adding of a base or base precursor (described later) to the light-sensitive layer instead of containing the base or base precursor in the light-sensitive material. In this case, employment of a sheet containing the base or base precursor (base sheet) is most easy and preferred. The image-forming method using the base sheet is described in Japanese Patent Provisional Publication No. 63(1988)-32546.

Further, the base of base precursor may be contained in the liquid employed in the image-forming method of the invention.

The image-forming method of the present invention will be described below.

In the image-forming method of the invention, the aforementioned development process is performed simultaneously with or after imagewise exposure.

Various exposure means can be employed in the imagewise exposure, and in general, a latent image of the silver halide is obtained by imagewise exposure to radiation including visible light. The kind of light source or the amount of light employed in the exposure can be selected depending on the light-sensitive wavelength determined by spectral sensitization or sensitivity of silver halide. An original image can be either monochromatic image or color image.

During the above development process, a polymerizable compound within the area where a latent image of the silver halide has been formed or within the area where a latent image of the silver halide has not been formed is polymerized. In a general system, the polymerizable compound within the area where the latent image has been formed is polymerized. However, the polymerizable compound within the area where the latent image has not been formed can be polymerized by controlling the kind or amount of the reducing agent, as described in Japanese Patent Provisional Publication No. 62(1987)-70836.

Through the heat-development process, a polymer image can be formed on the light-sensitive layer. A color image can be also obtained by fixing a dye or pigment on the polymer image.

As described in Japanese Patent Provisional Publication No. 62(1987)-209444, a color image can be also formed on the light-sensitive material using two kinds of substances which form a color when brought into contact with each other. In this method, one of the substances is contained in microcapsules dispersed in the light-sensitive layer and the other is arranged outside of the microcapsules, and the light-sensitive material having been subjected to the development process is pressed to rupture the microcapsules so as to bring into contact the two kinds of substances with each other.

An image-receiving material can be employed to form a polymer image.

After the development process, the light-sensitive is pressed onto an image-receiving material to transfer the unpolymerized polymerizable compound to the image-receiving material, whereby a polymer image can be formed on the image-receiving material. For applying a pressure on the light-sensitive material, various known methods can be employed.

In the case that the light-sensitive layer contains a color image forming substance, the light-sensitive material is subjected to the heat development process to cure the polymerizable compound, and thereby the color image forming substance in the cured portion is fixed. Then, the light-sensitive material is pressed on an image-receiving material to transfer the color image forming substance in the uncured portion to the image-receiving material. Thus, a color image can be formed on the image-receiving material.

After the image is formed on the image-receiving material, the image-receiving material can be heated to polymerize the transferred unpolymerized polymerizable compound as described in Japanese Patent Provisional Publication No. 62(1987)-210459. Through the above-mentioned process, the obtained image can be improved in the preservability.

The image-forming method of the invention can be used for monochromatic or color photography, printing, radiography, medical diagnosis (e.g., CRT photography of diagnostic device using ultrasonic wave), copy (e.g., computer-graphic hard copy), etc.

The light-sensitive material employable in the image-forming method of the present invention will be described in detail hereinafter.

The light-sensitive material comprises a support and a light-sensitive layer provided thereon which contains a silver halide, a reducing agent and a polymerizable compound.

Examples of the silver halides employable in the light-sensitive material include silver chloride, silver bromide, silver iodide, silver chlorobromide, silver chloroiodide, silver iodobromide and silver chloroiodobromide in the form of grains.

The halogen composition of individual grains may be homogeneous or heterogeneous. The heterogeneous grains having a multi-layer structure in which the halogen composition varies from the outer surface portion (i.e., shell) to the inside portion (i.e., core) are described Japanese Patent Provisional Publication Nos. 57(1982)-154232, 58(1983)-108533, 59(1984)-48755 and 59(1984)-52237, U.S. Pat. No. 4,433,048, and European Pat. No. 100,984. A silver halide grain having a core/shell structure in which the silver iodide content in the shell is higher than that in the core can be also employed as described in Japanese Patent Provisional Publication No. 62(1987)-183453.

There is no specific limitation on the crystal habit of silver halide grains. For example, a tubular grain having an aspect ratio of not less than 3 can be used as described in Japanese Patent Provisional Publication No. 62(1987)-210455.

It is preferred to use silver halide grains having a relatively low fogging value, as described in Japanese Patent Provisional Publication No. 63(1988)-68830.

Two or more kinds of silver halide grains which differ in halogen composition, crystal habit, grain size, and/or other features from each other can be employed in combination.

There is no specific limitation on the grain size distribution of silver halide grains. For example, silver halide grains having an almost uniform grain size distribution can be employed, as described in Japanese patent Provisional Publication No. 62(1987)-210448.

The silver halide grains preferably have a mean grain (or particle) size of 0.001 to 5 $\mu$m, more preferably 0.001 to 2 $\mu$m.

The amount of the silver halide contained in the light-sensitive layer preferably is in the range of 0.1 mg/m$^2$ to 10 g/m$^2$ in terms of silver contained the silver halide and an organic silver salt which is one of optional components. The amount of the silver halide contained in the light-sensitive layer preferably is not more than 1 g/m$^2$, more preferably in the range of 1 to 500 mg/m$^2$, in terms of silver contained in only the silver halide.

The reducing agent employable in the light-sensitive material has a function of reducing the silver halide and/or a function of accelerating or restraining polymerization of the polymerizable compound. Examples of the reducing agents having those functions include various compounds such as hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2-sulfonamidoindanones, 4-sulfonamido-5-pyrazolones, 3-sulfonamidoindoles, sulfonamidopyrazolobenzimidazoles, sulfonamidopyrazolotriazoles, $\alpha$-sulfonamidoketones and hydrazines. By adjustment of the kinds, amounts, etc. of the above reducing agents, the polymerizable compound can be polymerized in either a portion where a latent image of the silver halide has been formed or a portion where a latent image has not been formed. When the polymerizable compound is polymerized in the portion where a latent image has not been formed, 1-phenyl-3-pyrazolidones are preferably employed as the reducing agent.

A variety of reducing agents having the above-mentioned functions are described in Japanese Patent Provisional Publications Nos. 61(1986)-183640, 61(1986)-188535, 61(1986)-228441, 62(1987)-70836, 62(1987)-86354, 62(1987)-86355 and 62(1987)-198849. In these publications, some reducing agents are described as developing agents or hydrazone derivatives. The above-mentioned reducing agents are also described in T. James, "The Theory of the Photographic Process", 4th edition, pp. 291-334 (1977), Research Disclosure Vol. 170, No. 17029, pp. 9-15 (June 1978), and Research Disclosure Vol. 176, No. 17643, pp. 22-31 (December 1978). A precursor of the reducing agent capable of releasing a reducing agent when it is heated or brought into contact with an base can be employed in place of the reducing agent, as described in Japanese Patent Provisional Publication No. 62(1987)-210446. The reducing agents and their precursors described in the above-mentioned publications and literature can be also employed for the light-sensitive material in the present invention. Accordingly, the terms "reducing agent(s)" in the present specification mean to include all of the reducing agents and the precursors described in the above-mentioned publications and literatures.

The reducing agents can be used singly or in combination as described those publications. In the case that two or more reducing agents are used in combination, certain interactions between these reducing agents may be expected. One of the interactions is for acceleration of reduction of silver halide (and/or an organic silver salt) through so-called superadditivity. Other interaction is for a chain reaction in which an oxidized state of one reducing agent formed by a reduction of silver halide (and/or an organic silver salt) induces or inhibits the polymerization of the polymerizable compound via oxidation-reduction reaction with other reducing agent. Both interactions may occur simultaneously, so that it is difficult to determine which of the interactions has occurred in practical use.

Concrete examples of the reducing agents include pentadecylhydroquinone, 5-t-butylcatechol, p-(N,N-diethylamino)phenol, 1-phenyl-4-methyl-4-hydroxymethyl-3-pyrazolidone, 1-phenyl-4-methyl-4-heptadecylcarbonyloxymethyl-3-pyrazolidone, 2-phenylsulfonylamino-4-hexadecyloxy-5-t-octylphenol, 2-phenylsulfonylamino-4-t-butyl-5-hexadecyloxyphenol, 2-(N-butylcarbamoyl)-4-phenylsulfonylaminonaphtol, 2-(N-methyl-N-octadecylcarbamoyl)-4-sulfonylaminonaphthol, 1-acetyl-2-phenylhydrazine, 1-acetyl-2-(p- or o-aminophenyl)hydrazine, 1-formyl-2-(p- or o-aminophenyl)hydrazine, 1-acetyl-2-(p- or o-methoxyphenyl)hydrazine, 1-lauroyl-2-(p- or o-aminophenyl)hydrazine, 1-trityl-2-(2,6-dichloro-4-cyanophenyl)hydrazine, 1-trityl-2- phenylhydrazine, 1-phenyl-2-(2,4,6-trichlorophenyl)hydrazine, 1-{2-(2,5-di-tert-pentylphenoxy)butyloyl}-2-(p- or o-aminophenyl)-hydrazine, 1-{2-(2,5-di-t-pentylphenoxy)butyloyl}-2-(p- or o-aminophenyl)hydrazine pentadecylfluorocaprylate salt, 3-indazolinone, 1-(3,5-dichlorobenzoyl)-2-phenylhydrazine, 1-trityl-2-[{(2-N-butyl-N-octylsulfamoyl)-4-methanesulfonyl}phenyl]hydrazine, 1-{4-(2,5-di-tert-pentylphenoxy)butyloyl}-2-(p- or o-methoxyphenyl)-hydrazine, 1-(methoxycarbonylbenzohydryl)-2-phenylhydrazine, 1-formyl-2-[4-{2-(2,4-di-tert-pentylphenoxy)butylamide}phenyl]hydrazine, 1-acetyl-2-[4-{2-(2,4-di-tert-pentylphenoxy)butylamido}phenyl]hydrazine, 1-trityl-2-[{2,6-dichloro-4-(N,N-di-2-ethylhexyl)carbamoyl}phenyl]hydrazine, 1-(methoxycarbonylbenzohydryl)-2-(2,4-dichlorophenyl)hydrazine, 1-trityl-2-[{2-(N-ethyl-N-octylsulfamoyl)-4-methanesulfonyl}-phenyl]hydrazine, 1-benzoyl-2-tritylhydrazine, 1-(4butoxybenzoyl)-2-tritylhydrazine, 1-(2,4-dimethoxybenzoyl)-2-tritylhydrazine, 1-(4-dibutylcarbamoylbenzoyl)-2-tritylhydrazine and 1-(1-naphthoyl)-2-tritylhydrazine.

The amount of the reducing agent in the light-sensitive layer preferably ranges from 0.1 to 1,500 mole % based on 1 mole silver (including the above-mentioned silver halide and the optional organic silver salt).

There is no specific limitation with respect to the polymerizable compound, except that the compound having an ethylenic unsaturated bond. Any known ethylenic unsaturated polymerizable compounds can be employed in the invention. In the case that the light-sensitive layer contains a color image forming substance, the polymerizable compounds are preferably cross-linkable compounds having plural polymerizable groups in the molecule, because such cross-linkable compounds favorably serve for fixing the color image forming substance in the course of polymerization hardening of the polymerizable compounds.

Examples of the compounds having an ethylenically unsaturated group include acrylic acid, salts of acrylic acid, acrylic esters, acrylamides, methacrylic acid, salts of methacrylic acid, methacrylic esters, methacrylamide, maleic anhydride, maleic acid esters, itaconic acid esters, styrene, styrene derivatives, vinyl ethers, vinyl esters, N-vinyl heterocyclic compounds, allyl ethers, allyl esters, and derivatives thereof.

Concrete examples of the acrylic esters include n-butyl acrylate, cyclohexyl acrylate, 2-ethylhexyl acrylate, benzyl acrylate, furfuryl acrylate, ethoxyethoxyethyl acrylate, dicyclohexyloxyethyl acrylate, nonylphenyloxyethyl acrylate, hexanediol diacrylate, butanediol diacrylate, neopentylglycol diacrylate, trimethylolpropane triacrylate, pentaerythritol tetraacrylate, dipentaerythritol pentaacrylate, dipentaerythritol hexacrylate, diacrylate of polyoxyethylenated bisphenol A, diacrylate of 2,2-dimethyl-3-hydroxypropane aldehyde and trimethylolpropane condensate, triacrylate of 2,2-dimethyl-3-hydroxypropion aldehyde and pentaerythritol condensate, polyacrylate of hydroxypolyether, polyester acrylate, and polyurethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and dimethacrylate of polyoxyalkylenated bisphenol A.

The polymerizable compounds can be used singly or in combination of two or more compounds. The light-sensitive material containing mixture of two or more polymerizable componds is described in Japanese Patent Provisional Publication No. 62(1987)-210445. Further, compounds formed by bonding a polymerizable group such as a vinyl group or a vinylidene group to a reducing agent is also employed as the polymerizable compounds. The light-sensitive materials using compounds which show functions as both the reducing agent and the polymerizable compound or both the color image forming substance and the polymerizable compound are included in embodiments of the light-sensitive material employable in the invention.

The amount of the polymerizable compound to be contained in the light-sensitive layer preferably ranges from 5 to 120,000 parts by weight, and more preferably from 12 to 12,000 parts by weight, per one part by weight of the silver halide.

The light-sensitive material can be prepared by arranging a light-sensitive layer containing the above-mentioned components on a support. There is no specific limitation with respect to the support. In the case that heat development is utilized in the use of the light-sensitive material, a material for the support preferably is resistant to heat given in the developing stage. Examples of the material employable for the preparation of the support include glass, paper, fine paper, coat paper, cast-coat paper, synthetic paper, metals and analogues thereof, films of polyester, acetyl cellulose, cellulose ester, polyvinyl acetal, polystyrene, polycarbonate and polyethylene terephthalate, and paper laminated with resin or polymer (e.g., polyethylene).

In the case that a porous material such as paper is employed as the support, the porous support preferably has a certain smoothness as described in Japanese Patent Provisional Publication No. 62(1987)-209529. As the paper support, there can be employed various paper supports such as a paper support having a low water absorption described in Japanese Patent Provisional Publication No. 63(1988)-38934; a paper support having a certain Bekk Smoothness described in Japanese Patent Provisional Publication No. 63(1988)-47754, a paper support having a low shrinkage ratio described in Japanese Patent Provisional Publication No.

63(1988)-81339; a paper support having a low permeation rate described in Japanese Patent Provisional Publication No. 63(1988)-81340, and a paper support having a pH value of 5 to 9 described in Japanese Patent Provisional Publication No. 63(1988)-97941.

Various embodiments of the light-sensitive materials, optional components which may be contained in the light-sensitive layer, and auxiliary layers which may be optionally arranged on the light-sensitive materials are described below.

In the light-sensitive material employable in the invention, the polymerizable compound is preferably dispersed in the light-sensitive layer in the form of oily droplets, as described in Japanese Patent Provisional Publication No. 62(1987)-78552. In the oily droplets may be contained other components for the formation of a light-sensitive layer such as a silver halide, a reducing agent and a color image forming substance. The light-sensitive material in which the silver halide is contained in the oily droplets is described in Japanese Patent Provisional Publication Nos. 62(1987)-209450 and 62(1987)-164040, and the light-sensitive material in which the reducing agent is further contained in the oily droplets is described in Japanese Patent Provisional Publication No. 62(1987)-183453. When the silver halide is to be contained in the oily droplets, the number of the silver halide grains to be contained in one oily droplent preferably is 5 or more, as described in Japanese Patent Provisional Publication No. 63(1988) -15239.

The oily droplet of the polymerizable compound is more preferably in the form of microcapsule. There is no specific limitation on the process for the formation of the microcapsule, and any known process can be applied to the invention. The light-sensitive material in which the oily droplet of the polymerizable compound is in the form of microcapsule is described in Japanese Patent Provisional Publication No. 61(1986)-278441.

There is no specific limitation on the shell materials of the microcapsules. The shell material of the microcapsule employabled in the invention preferably has impermeability to the liquid to be contained in the light-sensitive layer in the image-formation stage. The light-sensitive materials using microcapsules having polyamide resin and/or polyester resin shell are described in Japanese Patent Provisional Publication No. 62(1987)-209437. The light-sensitive materials using microcapsules having polyurea resin and/or polyurethane resin shell are described in Japanese Patent Provisional Publication No. 62(1987)-209438. The light-sensitive materials using microcapsules having amino-aldehyde resin shell are described in Japanese Patent Provisional Publication No. 62(1987)-209439. The light-sensitive materials using microcapsules having gelatin shell are described in Japanese Patent Provisional Publication No. 62(1987)-209440. The light-sensitive materials using microcapsules having epoxy resin shell are described in Japanese Patent Provisional Publicational Publication No. 62(1987)-209441. The light-sensitive materials using microcapsules having multi-layer shell of polyamide resin and/or polyurea resin are described in Japanese Patent Provisional Publication No. 62(1987)-209447. The light-sensitive materials using microcapsules having multi-layer shell of polyurethane resin and/or polyester resin are described in Japanese Patent Provisional Publication No. 62(1987)-209447.

In the case of using the microcapsules of aldehyde type, the residue of aldehyde is preferably lower than a certain amount as in the light-sensitive materials described in Japanese Patent Provisional Publication No. 63(1988)-32535.

In the case that the silver halide is contained in the microcapsule, the silver halide preferably exist in the shell material of the microcapsule. The light-sensitive materials using microcapsules containing the silver halide in the shell material are described in Japanese Patent Provisional Publication No. 62(1987) -169147.

There can be employed two or more kinds of microcapsules in combination which are different from each other in at least one component among the components capable of being contained in microcapsules such as a silver halide, a reducing agent, a polymerizable compound and a color image forming substance (optional component, described hereinafter). Especially in the case of forming a full-color image, three or more kinds of microcapsules having different color phases are preferably employed in combination. The light-sensitive materials using two or more kinds of microcapsules in combination are described in Japanese Patent Provisional Publication No. 62(1987)-198850.

The mean particle size of the microcapsules preferably is in the range of 3 to 20 $\mu$m. The microcapsule preferably has a homogeneous particle distribution as described in Japanese Patent Provisional Publication No. 63(1988)-5334. The thickness of the shell of the microcapsule preferably is larger than a certain value against the particle diameter of the microcapsule as described in Japanese Patent Provisional Publication No. 63(1988)-81336.

In the case that the silver halide grains are contained in microcapsules, the mean grain size of the silver halide preferably is not more than one fifth parts of the mean size of the microcapsules, more preferably not more than one tenth parts of the mean size of the microcapsules. When the mean size of the microcapsules is not more than one fifth parts of the mean grain size of silver halide, even and uniform image can be obtained.

The light-sensitive layer may further contain optional components such as color image forming substances, sensitizing dyes, organic silver salts, radical generators, various kinds of image formation accelerators, thermal polymerization inhibitors, thermal polymerization initiators, development stopping agents, fluorescent brightening agents, discoloration inhibitors, antihalation dyes or pigments, antiirradiation dyes or pigments, dyes discolored by irradiation with light, matting agents, antismudging agents, plasticizers, water releasers, binders, photo polymerization initiators, solvents of the polymerizable compound, water soluble vinyl polymers and hardening agents.

In the light-sensitive material, a polymer image can be obtained on the light-sensitive layer having the above-mentioned constitution. Further, a color image can be obtained on the light-sensitive layer by incorporating a color image forming substance as an optional component into the light-sensitive layer.

There is no specific limitation with respect to the color image forming substance, and various kinds of substances can be employed. Examples of the color image forming substance include colored substance (i.e., dyes and pigments) and non-colored or almost non-colored substance (i.e., color former or dye- or pigment-precursor) which develops to give a color under application of external energy (e.g., heating, pressing, light irradiation, etc.) or by contact with other components (i.e., developer). The light-sensitive materials using the color image forming substance are described in Japanese Patent Provisional Publication No. 61(1986)-73145. The light-sensitive material using a dye or pigment as the color image forming substance is described in Japanese Patent Provisional Publication No. 62(1987)-187346. The light-sensitive material using a dye or pigment as the color image forming substance is described in Japanese Patent Provisional Publication No. 62(1987)-187346. A light-sensitive material using a dye or pigment as the color image forming substance is described in Japanese Patent Provisional Publication No. 62(1987)-187346. The light-sensitive material using a leuco dye is described in Japanese Patent Provisional Publication No. 62(1987)-209436. The light-sensitive material using a triazen compound is described in Japanese Patent Provisional Publication No. 62(1987)-251741. The light-sensitive material using a leuco dye which gives a yellow color is described in Japanese Patent Provisional Publication Nos. 62(1987)-288827 and 62(1987)-288828. The light-sensitive material using a leuco dye which gives a cyan color is described in Japanese Patent Provisional Publication Nos. 63(1988)-53542. Examples of dyes and pigments (i.e., colored substance) employable in the invention include commercially available ones as well as various known compounds described in the technical publications, for example, Yuki Gosei Kagaku Kyokai (ed.), Handbook of Dyes (in Japanese, 1970) and Nippon Ganryo Gijutsu Kyokai (ed.,), New Handbook of Pigments (in Japanese, 1977). Those dyes and pigments can be used in the form of a solution or dispersion.

Examples of the substances which develop to give a color by certain energy include thermochromic compounds, Piezochromic compounds, photochromic compounds and leuco compounds derived from triarylmethane dyes, quinone dyes, indigoid dyes, azine dyes, etc. Those compounds can develop to give a color by heating, application of pressure, light-irradiation or air-oxidation.

Examples of the substances which develop to give a color in contact with other components include various compounds capable of developing a color through some reaction between two or more components, such as acid-base reaction, oxidation-reduction reaction, coupling reaction, chelating reaction, and the like. Examples of such color formation systems are described in Hiroyuki Moriga, "Introduction of Chemistry of Speciality Paper" (in Japanese, 1975), pp. 29–58 (pressure-sensitive copying paper), pp. 87–95 (azo-graphy), pp. 118–120 (heat-sensitive color formation by a chemical change) or in MSS. of the seminer promoted by the Society of Kinki Chemical Industry, "The Newest Chemistry of Coloring Matter—Attractive Application and New Development as a Functional Coloring Matter", pp. 26–32 (June, 19, 1980). Examples of the color formation systems specifically include a color formation system used in pressure-sensitive papers, etc., comprising a color former having a partial structure of lactone, lactam, spiropyran, etc., and an acidic substance (developer), e.g., acid clay, phenol, etc.; a system utilizing azo-coupling reaction between an aromatic a diazonium salt, diazotate or diazosulfonate and naphthol, aniline, active methylene, etc.; a system utilizing a chelating reaction, such as a reaction between hexamethylenetetramine and a ferric ion and gallic acid, or a reaction between a phenolphthalein-complexon and an alkaline earth metal ion; a system utilizing oxidation-reduction reaction, such as a reaction between ferric stearate and pyrogallol, or a reaction between silver behanate and 4-methoxy-1-naphthol, etc.

The color image forming substance is preferably used in an amount of 0.5 to 50 parts by weight, more preferably 2 to 30 parts by weight, per 100 parts by weight of the polymerizable compound. In the case that the developer is employed, the amount of the developer is preferably in the range of approx. 0.3 to 80 parts by weight per one part by weight of the color former.

In the case of using two kinds of color image forming substances which give a color when they are brought into contact with each other (e.g., color former and a developer), one substance and the polymerizable compound are contained in the microcapsule, and the other is arranged outside of the microcapsule in the light-sensitive layer, whereby a color image can be formed on the light-sensitive layer. The light-sensitive material in which a color image can be obtained without using an image-receiving material as described above is described in Japanese Patent Provisional Publication No. 62(1987)-209444.

There is no specific limitation with respect to the sensitizing dyes, and any known sensitizing dyes used in the conventional art of photography may be employed in the light-sensitive material. Examples of the sensitizing dyes include methine dyes, cyanine dyes, merocyanine dyes, complex cyanine dyes, complex merocyanine dyes, holopolar cyanine dyes, hemicyanine dyes, styryl dyes, and hemioxonol dyes. These sensitizing dyes can be employed singly or in combination, but two or more sensitizing dyes are generally employed in combination for the purpose of supersensitization. In addition to the sensitizing dye, a substance which does not per se exhibit spectral sensitization effect or does not substantially absorb visible light but shows supersensitizing activity can be employed. The amount of the sensitizing dye to be added generally ranges from approx. $10^{-8}$ to $10^{-2}$ mole per 1 mole of the silver halide.

The sensitizing dye is preferably added during the stage of the preparation of the silver halide emulsion. The sensitizing dye can be added in the stage of the preparation of the silver halide grains as described in Japanese Patent Provisional Publication No. 62(1987)-947. The sensitizing dye can be also added in the stage of the preparation of the silver halide emulsion after preparing the silver halide grains as described in Japanese Patent Provisional Publication No. 62(1987)-210449. Concrete examples of the sensitizing dyes are described in Japanese Patent Provisional Publication Nos. 62(1987)-947 and 62(1987)-210449. The sensitizing dye having a sensitivity within the infrared region can be also employed in combination as described in Japanese Patent Provisional Publication No. 62(1987)-210449.

Adding of an organic silver salt to the light-sensitive material is particularly effective for the heat development. The reason is assumed that the organic silver salt takes part in a redox reaction using a silver halide latent image as a catalyst when heated to a temperature of 80° C. or higher. In such case, the organic silver salt is preferably located in contact with the silver halide or closely to the silver halide. Examples of organic compounds employable for forming such organic silver salt include aliphatic or aromatic carboxylic acids, thiocarbonyl group-containing compounds having a mercapto group or an α-hydrogen atom, and imino group-containing compounds. Among them, benzotriazoles are most preferred. The organic silver salt is generally used in an amount of from 0.01 to 10 mole, preferably from 0.01 to 1 mole, per 1 mole of the silver halide. Instead of the organic silver salt, an organic compound (e.g., benzotriazole) which can form an organic silver salt in combination with an inorganic silver salt can be added to the light-sensitive layer to obtain the same effect. The light-sensitive material using the organic silver salt is described in Japanese Patent Provisional Publication No. 62(1987)-3246. The above-mentioned organic silver salt is preferably used in an amount of 0.1 to 10 mole, more preferably 0.01 to 1 mole, per 1 mole of the silver halide.

A radical generator which accelerates (or inhibits) polymerization of the reducing agent may be contained in the light-sensitive layer. A light-sensitive material using a triazene silver as the radical generator is described in Japanese Patent provisional Publication No. 62(1987)-195639. A light-sensitive material using a silver diazotate as the radical generator is described in Japanese Patent Provisional Publication No. 62(1987)-195640. A light-sensitive material using an azo compound as the radical generator is described in Japanese Patent Provisional Publication No. 62(1987)-195641.

Various image formation accelerators are employable in the light-sensitive material. The image formation accelerators have a function to accelerate the oxidation-reduction reaction between a silver halide (and/or an organic silver salt) and a reducing agent, a function to accelerate emigration of an image forming substance from a light-sensitive layer to an image-receiving material or an image-receiving layer (described hereinafter), or a similar function. The image formation accelerators can be classified into inoragnic bases, organic bases, base precursors, oils, surface active agents, compounds functioning as an antifogging agent and/or a development accelerator, hot-melt solvents, compounds functioning as antioxidants, and the like, from the viewpoint of physiochemical functions. These groups, however, generally have certain combined functions, that is, two or more of the above-mentioned effects, so that the above classification is for the sake of convenience, and one compound often has a plurality of functions combined.

Examples of the image formation accelerators are given below.

Preferred examples of the inorganic bases include hydroxides of alkali metals or alkaline earth metals; secondary or tertiary phosphates, borates, carbonates, quinolinates and metaborates of alkali metals or alkaline earth metals; a combination of zinc hydroxide or zinc oxide and a chelating agent; ammonium hydroxide; hydroxides of quaternary alkylammoniums; and hydroxides of other metals. Preferred examples of the organic bases include aliphatic amines (e.g., trialkylamines, hydroxylamines and aliphatic polyamines); aromatic amines (e.g., N-alkyl-substituted aromatic amines, N-hydroxylalkyl-substituted aromatic amines and bis[p-(dialkylamino)-phenyl]-methanes), heterocyclic amines, amidines, cyclic amidines, guanidines, and cyclic guanidines. Of these bases, those having a pKa of 7 or more are preferred.

The base precursors preferably are those capable of releasing bases upon reaction by heating, such as salts between bases and organic acids capable of decarboxylation by heating, compounds capable of releasing amines through intramolecular nucleophilic substitution, Lossen rearrangement, or Beckmann rearrangement, and the like; and those capable of releasing bases by electrolysis. Examples of the base precursors include guanidine trichloroacetate, piperidine trichloroacetate, morpholine trichloroacetate, p-toluidine trichloroacetate, 2-picoline trichloroacetate, guanidine phenylsulfonylacetate, guanidine 4-chlorophenylsulfonylacetate, guanidine 4-methyl-sulfonylphenylsulfonylacetate, and guanidine 4-acetylaminomethyl propionate.

The bases or the base precursors can be employed in the amount of wide range in the light-sensitive material. The base or base precursor is preferably employed in an amount of not more than 100% by weight, more preferably from 0.1 to 40% by weight, based on the total solid content of the light-sensitive layer. These bases or base precursors can be used singly or in combination.

The light-sensitive material employing the base or base precursors is described in Japanese Patent Provisional Publication No. 62(1987)-264041. The light-sensitive material employing a tertiary amine as the base or base precursor is described in Japanese Patent Provisional Publication No. 62(1987)-170954. The light-sensitive material employing dispersed grains of hydrophobic base compound having a melting point of 80° C. to 180° C. is described in Japanese Patent Provisional Publication No. 62(1987)-209523. The light-sensitive material employing guanidine derivatives having a solubility of not more than 0.1% is described in Japanese Patent Provisional Publication No. 62(1987)-215637. The light-sensitive material employing hydroxydes of alkali metals or alkaline earth metals or salt is described in Japanese Patent Provisional Publication No. 62(1987)-209448.

The light-sensitive material employing acetylide compounds as the base precursor is described in Japanese Patent Provisional Publication No. 63(1988)-24242. The light-sensitive material employing salts of propiolic acid as the base precursor and further containing silver, copper, silver compound or copper compound as the catalyst of the base production reaction is described in Japanese Patent Provisional Publication No. 63(1988)-46446. The light-sensitive material containing the salts of propiolic acid under the condition of being separated from the silver, copper, silver compound or copper compound is described in Japanese Patent Provisional Publication No. 63(1988)-81338. The light-sensitive material containing free ligands in addition to the salts of propiolic acid and the silver, copper, silver compound or copper compound is described in Japanese Patent Provisional Publication No. 63(1988)-97942. The light-sensitive material employing salts of the propiolic acid as the base precursor and further containing heat fusible compounds as the accelerator of the base production reaction is described in Japanese Patent Provisional Publication No. 63(1988)-46447. The light-sensitive material employing salts of sulfonyl acetate as the base precursor and further containing heat fusible compounds as the accelerator of the base production reaction is described in Japanese Patent Provisional Publication No. 63(1988)-48543. The light-sensitive material employing compounds in which isocyanate or isothiocyanate is bonded to organic base is described in Japanese Patent Provisional Publication No. 63(1988)-24242.

In the case of using the base or the base precursor in the light-sensitive material, it is preferred that the silver halide, the reducing agent and the polymerizable compound are contained in the aforementioned microcapsules, and the base or base precursor is arranged outside of the microcapsule in the light-sensitive layer. Otherwise, the base or base precursor can be contained in different microcapsules from those containing the polymerizable compound as described in Japanese Patent Provisional Publication No. 62(1987)-209521. The base or base precursor can be contained in the microcapsules under the condition that the base or base precursor is dissolved or dispersed in an aqueous solution of a water retention agent as described in Japanese Patent Provisional Publication No. 62(1987)-209522, or under condition that the base or base precursor is adsorbed on solid particles as described in Japanese Patent Provisional Publication No. 62(1987)-209526. The base or base precursor contained in the microcapsules preferably has a melting point in the range of 70° to 210° C. as described in Japanese Patent Provisional Publication No. 63(1988)-65437. Further, the base or base precursor can be dissolved in grains in combination with hydrophobic substance as described in Japanese Patent Provisional Publication No. 63(1988)-97943.

The base or base precursor can be contained in a layer different from the light-sensitive layer as described in Japanese Patent Provisional Publication No. 62(1987)-253140. The layer containing base or base precursor will be described hereinafter. Further, the base or base precursor may be contained in the aforementioned porous support as described in Japanese Patent Provisional Publication No. 63(1988)-32546.

Examples of the oils employable in the invention include high-boiling organic solvents which are used as solvents for emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

The compounds functioning as an antifogging agent and/or a development accelerator can be used to give an image of high sharpness having a high maximum density and a low minimum density (i.e., an image having high S/N ratio). Examples of the compounds functioning as an antifogging agent and/or a development accelerator include a conventional antifogging agent described in Japanese Patent Provisional Publication No. 62(1987)-151838; a compound having a cyclic amide structure described in Japanese Patent Provisional Publication No. 61(1986)-151841; a thioether compound described in Japanese Patent Provisional Publication No. 62(1987)-151842; a polyethylene glycol derivative described in Japanese Patent Ptovisional Publication No. 62(1987)-151843; a polyethylene glycol derivative described in Japanese a thiol derivative described in Japanese Patent Provisional Publication No. 62(1987)-151844; an acetylene compound described in Japanese Patent Provisional Publication No. 62(1987)-178232; a sulfonamide derivative described in Japanese Patent Provisional Publication No. 62(1987)-183450; and a salt of quaternary ammonium ion described in Japanese Patent Provisional Publication No. 63(1988)-91653.

The hot-melt solvents preferably are compounds which may be used as a solvent of the reducing agent or those which have high dielectric constant and can accelerate physical development of silver salts. Examples of the hot-melt solvents include polyethylene glycols, derivatives of polyethylene oxides (e.g., oleate ester), bees wax, monostearin and high dielectric constant compounds having -SO$_2$- and/or -CO- group described in U.S. Pat. No. 3,347,675; polar compounds described in U.S. Pat. No. 3,667,959; and 1,10-decanediol, methyl anisate and biphenyl suberate described in Reserch Disclosure, pp. 26-28 (December 1976). The light-sensitive material employing the hot-melt solvent is described in Japanese Patent Provisional Publication No. 62(1987)-86355.

The compounds functioning as an antioxidant can be employed for the purpose of eliminating the oxygen influence (oxygen has a function as a polymerization inhibitor). An example of the compounds functioning as an antioxidant is a compound having two or more mercapto groups as described in Japanese Patent Provisional Publication No. 62(1987)-209443.

The thermal polymerization initiators employable in the light-sensitive material are compounds which are decomposed under heating to generate a polymerization initiating species, particularly a radical, and those generally employed as an initiator of radical polymerization. The thermal polymerization initiators are described in "Addition Polymerization and Ring Opening Polymerization", pp. 6–18, edited by the Editorial Committee of High Polymer Experimental Study of the High Polymer Institute, published by Kyoritsu Shuppan (1983). Examples of the thermal polymerization initiators include azo compounds, e.g., azobisisobutyronitrile, 1,1'-azobis-(1-cyclohexanecarbonitrile), dimethyl 2,2'-azobisiso-butyrate, 2,2'-azobis(2-methylbutyronitrile), and azobisdimethylvaleronitrile; organic peroxides, e.g., benzoyl peroxide, di-tert-butyl peroxide, dicumyl peroxide, tert-butyl hydroperxide, and cumene hydroperoxide; inorganic peroxides, e.g., jydrogen peroxide, potassium persulfate, and ammonium persulfate; and sodium p-toluenesulfinate. The thermal polymerization initiator is preferably used in an amount of from 0.1 to 120%. by weight, more preferably from 1 to 10% by weight, based on the amount of the polymerizable compound. In a system in which the polymerizable compound within the area where the latent image has bot been formed is polymerized, the thermal polymerization initiators are preferably incorporated into the light-sensitive layer. The light-sensitive material using the thermal polymerization initiators is described in Japanese Patent Provisional Publication No. 62(1987)-70836.

The development stopping agents demployable in the light-sensitive material are compounds that neutralize a base or react with a base to reduce the base concentration in the layer to thereby stop development, or compounds that mutually react with silver or a silver salt to suppress development. More specifically, examples of the development stopping agent include acid precursors capable of releasing acids upon heating electrophilic compounds capable of undergoing substitution reaction with a coexisting base upon heating, nitrogen-containing heterocyclic compounds, mercapto compounds, and the like. Examples of the acid precursors include oxide esters described in Japanese Patent Provisional Publication Nos. 60(1985)-108837 and 60(1985)-192939 and compounds which release acids through Lossen rearrangement described in Japanese Patent Provisional Publication No. 60(1985)-230133. Examples of the electrophilic compounds which induce substitution reaction with abses upon heating are described in Japanese Patent Provisional Publication No. 60(1985)-230134.

For the purpose of anti-halation or anti-irradiation, dyes or pigments can be added to the light-sensitive layer of the light-sensitive material. The light-sensitive material comprising the light-sensitive layer which contains white pigment for the purpose of anti-halation or anti-irradiation is described in Japanese Patent Provisional Publication No. 63(1988)-29748.

In the case that the light-sensitive layer of the light-sensitive material employs microcapsules, the dyes having properties of being decolorized when it is heated or irradiated with light can be used. The dyes having such properties can be used in the light-sensitive material as a yellow filter layer in a conventional silver salt photographic system. The light-sensitive material employing the dys having the above properties is described in Japanese Patent Provisional Publication No. 63(1988)-97940.

The antismudging agents employable in the light-sensitive material preferably are particles which are solid at ambient temperatures. Examples of the anti-smudging agents include starch particles described in U.K. Pat. No. 1,232,347; polymer particles described in U.S. Pat. No. 3,625,736; microcapsule particles containing no color former described in U.K. Pat. No. 1,235,991; and cellulose particles, and inorganic particles, such as particles of talc, kaolin, bentonite, aglmatolite, zinc oxide, titanium dioxide or aluminum oxide described in U.S. Pat. No. 2,711,375. Such particles preferably have a mean size of 3 to 50 μm, more preferably 5 to 40 μm. The size of the particle is preferably larger than that of the microcapsule. In the case that the oily droplets of the polymerizable compound is in the form of microcapsules, the size of the particle is preferably larger than that of the microcapsule.

The binder employable in the light-sensitive material can be contained in the light-sensitive layer singly or in combination. The binder preferably is a hydrophilic binder, and representative hydrophilic binders are transparent or semi-transparent binders. Examples of the binders include natural substances such as gelatin, gelatin derivatives, cellulose derivatives, starch and gum arabic, and synthetic polymeric substances such as watersoluble polyvinyl compounds (e.g., polyvinyl alcohol, polyvinylpyrrolidone and acrylamide polymers). Other synthetic polymeric substances such as vinyl compounds dispersed in the form of latex, which are particularly effective to increase dimensional stability of photographic materials, can be also employed. The binder is preferably employed in an amount of 2 to 100 wt. % based on the amount of the polymerizable compound. The lightsensitive material using the binder is described in Japanese Patent Provisional Publication No. 61(1986)-69062. The light-sensitive material using both of the binder and the microcapsules is described in Japanese Patent Provisional Publication No. 62(1987)-209525.

In the light-sensitive material employable in the invention, a hydrophilic binder is preferably used as the binder in combination with a hardener. When the hydrophilic binder is hardened, the light-sensitive layer containing a liquid such as water can be enhanced in the physical properties.

There is no specific limitation on the hardening agent employable in the light-sensitive material. Examples of known hardening agent include aldehydes such as formaldehyde, glyoxal and glutaraldehyde, N-methylol compounds such as dimethylol urea and methylol dimethylhydantoin, dioxane derivatives such as 2,3-dihydroxydioxane, active vinyl compounds such as 1,3,5-triacryloylhexahydro-s-triazine, bis(vinylsufonylacetamide) and N,N'-trimethylene-bis(vinylsulfonylacetamide), active halogen compounds such as 2,4-dichloro-6-hydroxy-s-triazine, mucohalogen acids such as mucochloric acid and mucopheonxychloric acid, isooxazoles, dialdehyde starch, 1-chloro-6-hydroxytriazinylated gelatin, and epoxy compounds such as

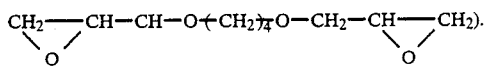

The hardening agent is preferably employed in an amount of 0.1 to 30 wt. %, more preferably 0.5 to 10 wt. %, of the hydrophilic binder.

A photopolymerization initiator can be contained in the light-sensitive layer of the light-sensitive material for the purpose of polymerization of the transferred unpolymerized polymerizable compound, as described in Japanese Patent Provisional Publication No. 62(1987)-161149.

In the case of using a solvent for the polymerizable compound, the solvent is preferably contained in a microcapsule which is different from the microcapsule containing the polymerizable compound. The light-sensitive material employing a polymerizable compound contained in a microcapsule and a blending organic solvent is described in Japanese Patent Provisional Publication No. 62(1987)-209524.

A water soluble vinyl polymer can be adsorbed on the aforementioned silver halide grains. The light-sensitive material employing the water soluble vinyl polymer is described in Japanese Patent Provisional Publication No. 63(1988)-91652.

Examples and usage of other components than the above-mentioned ones which can be optionally contained in the light-sensitive layer are also described in the above-mentioned publications concerning the light-sensitive material, and in Research Disclosure Vol. 170, No. 17029, pp. 9-15 (June 1978).

The light-sensitive layer of the light-sensitive material comprising the above-mentioned components preferably has a pH value of not more than 7 as described in Japanese Patent Provisional Publication No. 62(1987)-275235.

Examples of auxiliary layers which are optionally arranged on the light-sensitive material include an image-receiving layer, a heating layer, an antistatic layer, an anti-curling layer, a peel layer, a cover sheet, a protective layer, a layer containing a base or a base precursor, a base barrier layer and an anti-halation layer (colored layer).

Instead of using an image-receiving material (described later), the above-mentioned image-receiving layer can be provided on the light-sensitive material to form an image on the image-receiving layer. The structure of the image-receiving layer provided on the light-sensitive material can be the same as that of the image-receiving material. Details of the image-receiving layer will be described hereinafter.

The light-sensitive material using a heating layer is described in Japanese Patent Provisional Publication No. 61(1986)-294434. The light-sensitive material provided with a cover sheet or a protective layer is described in Japanese Patent Provisional Publication No. 62(1987)-210447. The light-sensitive material provided a layer containing a base or a base precursor is described in Japanese Patent Provisional Publication No. 62(1987)-253140. The light-sensitive material provided with a colored layer as the anti-halation layer is described in Japanese Patent Provisional Publication No. 63(1988)-101842. The light-sensitive material provided with a base barrier layer is described in Japanese Patent Provisional Publication No. 62(1987)-253140. Examples of other auxiliary layers and usage thereof are described in the above-mentioned publications concerning the light-sensitive materials.

The process for the prerparation of a light-sensitive material is described below.

Various processes can be employed for preparing a light-sensitive material. In a generally known process, a light-sensitive material can be prepared by dissolving, emulsifying or dispersing each of the components of the light-sensitive layer in an adequate solvent to obtain a coating solution, then applying the solution onto the aforementioned support, and drying the coated layer of the solution.

The coating solution can be generally prepared by preparing liquid compositions each composition containing each component and mixing those compositions with each other. Each of the liquid compositions may contain plural components. Some components of the light-sensitive layer can be directly added to the coating solution or the liquid composition. Further, a secondary composition can be prepared by emulsifying the oily (or aqueous) composition in an aqueous (or oily) medium to obtain the coating solution.

Processes for the preparation of the liquid composition and the coating solution are described below.

The silver halide emulsion can be prepared by any known processes such as an acid process, a neutral process or an ammonia process.

In the stage for the preparation, a soluble silver salt and a soluble halogen salt can be reacted in accordance with a single jet process, a double jet process or a combination thereof. A reverse mixing method in which grains are formed in the presence of excess silver ions, or a controlled double jet process in which a pAg value is maintained constant, can be also employed. In order to accelerate grain growth, the concentrations or amounts or the silver salt and halogen salt to be added or the rate of their addition can be increased as described in Japanese Patent Provisional Publications Nos. 55(1980)-158124 and 55(1980)-158124 and U.S. Pat. No. 3,650,757.

The silver halide emulsion may be of a surface latent image type that forms a latent image predominantly on the surface of silver halide grains, or of an inner latent image type that forms a latent image predominantly in the inside of the grains. A direct reversal emulsion comprising an inner latent image type emulsion and a nucleating agent may be employed. The inner latent image type emulsion suitable for this purpose is described in U.S. Pat. Nos. 2,592,250 and 3,761,276, Japanese Patent Publication No. 58(1983)-3534 and Japanese Patent Provisional Publication No. 58(1983)-136641, etc. The nucleating agent that is preferably used in combination with the inner latent image type emulsion is described in U.S. Pat. Nos. 3,227,552, 4,245,037, 4,255,511, 4,266,013 and 4,276,364, and West German Patent Provisional Publication (OLS) No. 2,635,316.

In the preparation of the silver halide emulsion, various hydrophilic colloids are advantageously used as protective colloids. Examples of employable hydrophilic colloids include proteins (e.g., gelatin, gelatin derivatives, gelatin grafted with other polymers, albumin and casein), cellulose derivatives (e.g., hydroxyethyl cellulose and cellulose sulfate), saccharide derivatives (e.g., sodium alginate and starch derivative), and a wide variety of synthetic hydrophilic polymers, such as polyvinyl alcohol, polyvinyl alcohol partial acetal, poly-N-vinylpyrrolidone, polyacrylic acid, polymethacrylic acid, polyacrylamide, polyvinylimidazole, and polyvinylpyrazole, and copolymers comprising monomers constituting these homopolymers. Among them, gelatin is most preferred. Examples of the employable gelatins include not only lime-treated gelatin but also acid-treated gelatin and enzyme-treated gelatin. Hydrolysis products or enzymatic decomposition products of gelatin can be also employed.

In the formation of silver halide grains in the silver halide emulsion, ammonia, an organic thioether derivative (see: Japanese Patent Publication No. 47(1972)-386) or sulfur-containing compound (see: Japanese Patent Provisional Publication No. 53(1978)-144319) can be used as a silver halide solvent. Further, in the grain formation or physical ripening, a cadmium salt, a zinc salt, a lead salt, a thallium salt, or the like can be introduced into the reaction system. Furthermore, for the purpose of improving high or low intensity reciprocity law failure, a water-soluble iridium salt, e.g., iridium (III) or (IV) chloride, or ammonium hexachloroiridate, or a water-soluble rhodium salt, e.g., rhodium chloride can be used.

After the grain formation or physical ripening, soluble salts may be removed from the resulting emulsion by a known noodle washing method or a sedimentation method. The silver halide emulsion may be used in the primitive condition, but is usually subjected to chemical sensitization. For the chemical sensitization of the emulsion employable for the light-sensitive material, there can be employed sulfur sensitization, reduction sensitization or noble metal sensitization, etc., singly or in combination. Those chemical sensitization processes can be carried out in the presence of a nitrogen-containing heterocyclic compound as described in Japanese Patent Provisional Publications Nos. 58(1983)-126526 and 58(1983)-215644.

When a sensitizing dye is added to the silver halide emulsion, the sensitizing dye is preferably added during the stage of preparation of the emulsion as described in the above-mentioned Japanese Patent Provisional Publication Nos. 62(1987)-947 and 62(1987)-210449. When the nitrogen-containing heterocyclic compound functioning as an antifogging agent and/or a development accerelator is added to the silver halide emulsion, the compound is preferably added during the stage of the formation or ripening of the silver halide grains. The process for the preparation of the light-sensitive material employing the nitrogen-containing heterocyclic compound is described in Japanese Patent Provisional Publication No. 62(1987)-161144.

When the organic silver salt is contained in the light-sensitive layer, the emulsion of the organic silver salt can be prepared in the similar manner to that in the preparation of the silver halide emulsion.

In the preparation of the light-sensitive material, the polymerizable compound can be used as a medium for the preparation of a liquid composition containing other components of the light-sensitive layer. For example, the silver halide (including silver halide emulsion), reducing agent, color image forming substance, and the like can be dissolved or emulsified in the polymerizable compound. Especially when the color image forming substance is used, the substance is preferably introduced into the polymerizable compound. Further, when the oily droplets of the polymerizable compound are made in the form of microcapsules, components of the shell material may be contained in the polymerizable compound.

A light-sensitive composition containing the polymerizable compound which contains the silver halide can be prepared using the silver halide emulsion. Otherwise, a silver halide powder prepared by lyophylization can be also employedother than the silver halide emulsion to prepare the light-sensitive composition. The light-sensitive composition can be obtained by stirring the polymerizable compound and the silver halide using a homogenizer, a blender, a mixer or other conventional stirring device.

A copolymer consisting of hydrophilic repeating unit and hydrophobic repeating unit is preferably dissolved in the polymerizable compound employed in the preparation of the light-sensitive composition, as described in Japanese Patent Provisional Publication No. 62(1987)-209449.

The light-sensitive composition can be also prepared by dispersing microcapsules containing silver halide emulsion as a core material in the polymerizable compound instead of employing the above copolymer, as described in Japanese Patent Provisional Publication No. 62(1987)-164041.

The polymerizable compound or the above-mentioned light-sensitive composition which further contains other components is preferably employed in the form of an emulsion in which the compound or the composition is emulsified in an aqueous medium. In the case of preparing microcapsules of oily droplets containing the polymerizable compound, it is possible that the shell material required for the preparation of microcapsules is added to the emulsion and the emulsion is then subjected to a process for forming a shell of microcapsule, as described in Japanese Patent Provisional Publication No. 61(1986)-275742. Otherwise, to the emulsion may be also added a reducing agent or other optional components.

Examples of the processes for preparing microcapsules (encapsulation processes) include a process utilizing coacervation of a hidrophilic shell material as described in U.S. Pat. Nos. 2,800,457 and 2,800,458; an interface polymerization process as described in U.S. Pat. No. 3,287,154, British Pat. No. 990,443, and Japanese Patent Publication Nos. 38(1963)-19574, 42(1967)-446 and 42(1967)-771; a polymer deposition process as described in U.S. Pat. Nos. 3,418,250 and 3,660,304; a process using an isocyanate-polyol shell material as described in U.S. Pat. No. 3,796,669; a process using an isocyanate shell material as described in U.S. Pat. No. 3,914,511; a process using an urea-formaldehyde or urea-formaldehyde-resilsinol shell material as described in U.S. Pat. Nos. 4,001,140, 4,087,376 and 4,089,802; a process using a shell material such as melamin-formaldehyde resin or hydroxypropylcellulose as described in U.S. Pat. No. 4,025,455; an in-situ process utilizing polymerization of monomers as described in Japanese Patent Publication No. 36(1961)-9168 and Japanese Patent Provisional Publication No. 51(1976)-9079; a polymerizationdispersion cooling process as described in U.K. Pat. Nos. 927,807 and 965,074; and a spray-drying process as described in U.S. Pat. No. 3,111,407 and U.K. Pat. No. 930,422. The process for encapsulation of oily droplets of the polymerizable compound is by no means restricted to the above-mentioned process, but most preferred is a process comprising emulsifying a core material and then forming a polymer film as a shell of the microcapsule around the core material.

The light-sensitive microcapsules employable for the preparation of the light-sensitive material are described in Japanese Patent Provisional Publication Nos. 62(1987)-169147, 62(1987)-169148, 62(1987)-209437, 62(1987)-209438, 62(1987)-209439, 62(1987)-209440, 62(1987)-209441, 62(1987)-209447 and 62(1987)-209442.

When the polymerizable compound is a light-sensitive composition containing the silver halide, the obtained emulsion of the polymerizable compound (including a microcapsule dispersion obtained by the above-mentioned process) can be employed per se as a coating solution for preparing a light-sensitive material. When the light-sensitive composition does not contain the silver halide, the obtained emulsion can be mixed with other emulsions such as a silver halide emulsion and an emulsion containing other optional component (e.g., organic silver salt) to prepare a coating solution. Other optional components can be also added to the coating solution.

The coating solution prepared as above is coated over a support, and the coated layer of the solution is dried to prepare a light-sensitive material. Coating of the solution over the support can be readily performed by known processes.

The image-receiving material employable in the image-forming method of the invention is described below. The image-forming method using an image-receiving material or an image-receiving layer is described in Japanese Patent Provisional Publication No. 61(1986)-278849.

As the support of the image-receiving material, there can be employed a baryta paper in addition to various materials employable as the support of the light-sensitive material. In the case that a porous material such as paper is employed as the support of the image-receiving material, the porous support preferably has a certain smoothness as described in Japanese Patent Provisional Publication No. 62(1987)-209530. An image-receiving material employing a transparent support is described in Japanese Patent Provisional Publication No. 62(1987)-209531.

The image-receiving material is usually prepared by providing an image-receiving layer on the support. The image-receiving layer can be constructed using a variety of comounds according to the color formation system. In the cases that a polymer image is formed on the image-receiving material and that a dye or pigment is employed as the color image forming substance, the image-receiving material can be composed of the support only.

For example, when a color formation system using a color former and a developer is employed, the developer can be contained in the image-receiving layer. Otherwise, the image-receiving layer can be composed of at least one layer containing a mordant. The mordant can be selected from various compounds which are known in the art of the conventional photography in consideration of nature of the color image forming substance. If desired, the image-receiving layer can be composed of two or more layers containing a plurality of mordants different from each other in the mordanting power.

The image-receiving layer preferably contains a polymer as a binder. The binder which is employable for the aforementioned light-sensitive layer can be also employed for the image-receiving layer. Further, a polymer having a lower transmission coefficient of oxygen can be used as the binder, as described in Japanese Patent Provisional Publication No. 62(1987)-209454.

The image-receiving layer can contain a thermoplastic compound. In the case that the thermoplastic compound is contained in the image-receiving layer, the image-receiving layer itself is preferably composed of an agglomerate of fine particles of the thermoplastic compound (i.e., granulated thermoplastic compound). The image-receiving layer having the above constitute has such advantages that the formation of a transferred image can be readily done and a glossy image can be obtained under heating after the image formation.

The image-receiving material having an image-receiving layer containing the granulated thermoplastic compound is described in Japanese Patent Provisional Publication Nos. 62(1987)-280071 and 62(1987)-280739.

A photopolymerization initiator or a thermal polymerization initiator may be contained in the image-receiving layer. In the image-formation process using an image-receiving material, a color image forming substance is transferred together with the unpolymerized polymerizable compound as described hereinafter, so that the photopolymerization initiator or thermal polymerization initiator can be contained in the image-receiving layer to smoothly perform the curing procedure (fixing procedure) of the unpolymerized polymerizable compound. The image-receiving material having the image-receiving layer containing a photopolymerization initiator is described in Japanese Patent Provisional Publication No. 62(1987)-161149. The image-receiving material having the image-receiving layer containing a thermal polymerization initiator is described in Japanese Patent Provisional Publication No. 62(1987)-210444.

A dye or pigment can be contained in the image-receiving layer for the purpose of entering letters, symbols, frames, etc. in the image-receiving layer, or of giving a certain color to the background for the image. Further, the dye or pigment can be also employed for the purpose of making it easy to distinguish the sides of the image-receiving material. As the dye of pigment, there can be employed a variety of known dyes or pigments employable for the image formation. However, in the case that the dye or pigment may disturb the image formed on the image-receiving layer, it is preferred to make the density of the dye or pigment low (e.g., reflection density of not higher than 1), or to employ a dye or pigment having a property of being discolored when it is heated or irradiated with light. The image-receiving material comprising the image-receiving layer which contains a dye or pigment having a property of being discolored when it is heated or irradiated with light is disclosed in Japanese Patent Provisional Publication No. 62(1987)-251741.

Further, when a white pigment such as titanium dioxide and barium sulfate is contained in the image-receiving layer, the image-receiving layer can function as a white reflection layer. In this case, the white pigment is used in an amount of 10 to 100 g based in 1 g of the thermoplastic compound.

The above-mentioned dye and pigment can be either uniformly or partially contained in the image-receiving layer. For example, when the support is composed of transparent material, the white pigment can be partially contained in the image-receiving layer to make a part of a reflection image transparent. Thus, information of the image which is unnecessary in the transparent image can be entered in the part of the image-receiving layer containing the white pigment as a reflection image.

The image-receiving layer can be composed of two or more layers according to the above-mentioned functions. The thickness of the image-receiving layer preferably ranges from 1 to 100 μm, more preferably from 1 to 20 μm.

A protective layer can be provided on the surface of the image-receiving layer. A layer composed of an agglomerate of granulated thermoplastic compound can be also provided on the surface of the image-receiving layer as described in Japanese Patent Provisional Publication No. 62(1987)-210460.

Further, other various layers such as a layer containing a self-adhesive or adhesive and a release paper can be laminated on the surface of the support not facing the image-receiving layer. A sticker type image-receiving material having the above structure is described in Japanese Patent Provisional Publication No. 63(1988)-24647.

The present invention is further described by the following examples without limiting the invention.

EXAMPLE 1

Preparation of silver halide emulsion (A-1) (blue-sensitive)

In 1,500 ml of water were dissolved 16 g of gelatin and 0.5 g of sodium chloride, and the resulting gelatin solution was adjusted to pH 3.2 using 1N-sulfuric acid and kept at 50° C. To the gelatin solution, 300 ml of an aqueous solution containing 71 g of potassium bromide and 300 ml of an aqueous solution containing 0.59 mole of silver nitrate were added simultaneously at the same feed rate over 50 minutes. After 1 minute, to the resulting mixture was added 43 ml of a 1% methanol solution of the following sensitizing dye (1).

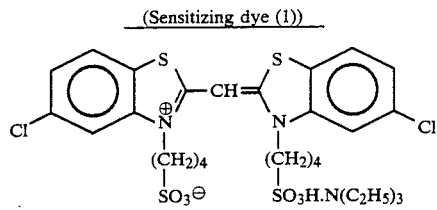

(Sensitizing dye (1))

After 15 minutes, to the resulting mixture were added 100 ml of an aqueous solution containing 2.9 g of potassium iodide and 100 ml of an aqueous solution containing 0.018 mole of silver nitrate at the same feed rate over 5 minutes. To the resulting emulsion was added 10 cc of a 10% alkali solution of isobutylene-maleic anhydride copolymer to perform precipitation, and the emulsion was washed with water for desalting. Then, 12 g of gelatin was dissolved in the emulsion. To the emulsion was further added 0.5 mg of sodium thiosulfate to perform chemical sensitization at 60° C. for 15 minutes, to obtain a silver iodobromide monodisperse emulsion (A-1) containing 14-hedral silver iodobromide grains having an average grain size of 0.22 μm. The yield of the emulsion was 1,000 g.

Preparation of silver halide emulsion (A-2) (green-sensitive)

In 1,600 ml of water were dissolved 20 g of gelatin and 0.5 g of sodium chloride, and the resulting gelatin solution was adjusted to pH 3.2 using 1N-sulfuric acid and kept at 42° C. To the gelatin solution, 200 ml of an aqueous solution containing 71 g of potassium bromide and 200 ml of an aqueous solution containing 0.59 mole of silver nitrate were added simultaneously at the same feed rate over 30 minutes. After 1 minute, to the resulting mixture was added 48 ml of a 1% methanol solution of the following sensitizing dye (2).

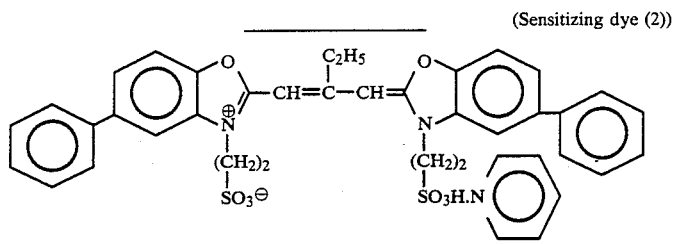

(Sensitizing dye (2))

After 10 minutes, to the resulting mixture were added 100 ml of an aqueous solution containing 2.9 g of potassium iodide and 100 ml of an aqueous solution containing 0.018 mole of silver nitrate at the same feed rate over 5 minutes. To the resulting emulsion was added 10 cc of a 10% alkali solution of isobutylene-maleic anhydride copolymer to perform precipitation, and the emulsion was washed with water for desalting. Then, in the emulsion was dissolved 18 g of gelatin. To the emulsion was further added 0.7 mg of sodium thiosulfate to perform chemical sensitization at 60° C. for 15 minutes, to obtain a silver iodobromide monodisperse emulsion (A-2) containing 14-hedral silver iodobromide grains having an average grain size of 0.12 μm. The yield of the emulsion was 1,000 g.

Preparation of silver halide emulsion (A-3) (red-sensitive)

In 1,600 ml of water were dissolved 20 g of gelatin and 0.5 g of sodium chloride, and the resulting gelatin solution was adjusted to pH 3.5 using 1N-sulfuric acid and kept at 45° C. To the gelatin solution, 200 ml of an aqueous solution containing 71 g of potassium bromide and 200 ml of an aqueous solution containing 0.59 mole of silver nitrate were added simultaneously at the same feed rate over 30 minutes. After 1 minute, to the resulting mixture was added 48 ml of a 0.5% methanol solution of the following sensitizing dye (3).

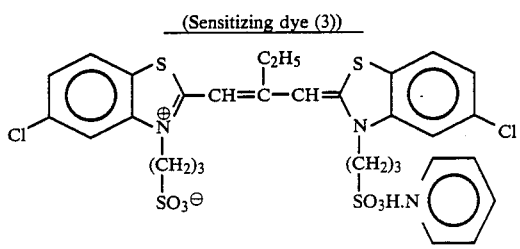

(Sensitizing dye (3))

After 15 minutes, to the resulting mixture were added 100 ml of an aqueous solution containing 3.65 g of potassium iodide and 100 ml of an aqueous solution containing 0.022 g of silver nitrate at the same feed rate over 5 minutes. To the resulting emulsion was added 10 cc of a 10% alkali solution of of isobutylene-maleic anhydride copolymer to perform precipitation, and the emulsion was washed with water for desalting. Then, to the emulsion was dissolved 10 g of gelatin. To the emulsion was further added 0.45 mg of sodium thiosulfate to perform chemical sensitization at 55° C. for 20 minutes, to obtain a silver iodobromide monodisperse emulsion (A-3) containing 14-hedral silver iodobromide grains having an average grain size of 0.13 μm. The yield of the emulsion was 1,000 g.

Preparation of light-sensitive composition (A-1)

In 100 g of the following polymerizable compound (trade name: Kayarad R604, available from Nippon Kayaku Co., Ltd.) were dissolved 1.2 g of the following copolymer and 15 g of the following yellow image forming substance.

(Polymerizable compound)

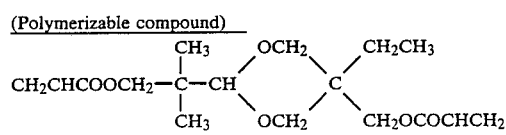

(Copolymer)

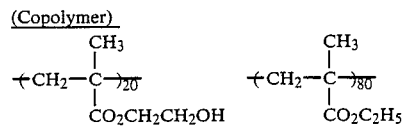

(Yellow image forming substance)

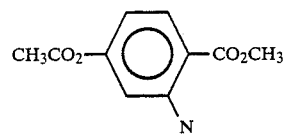

-continued

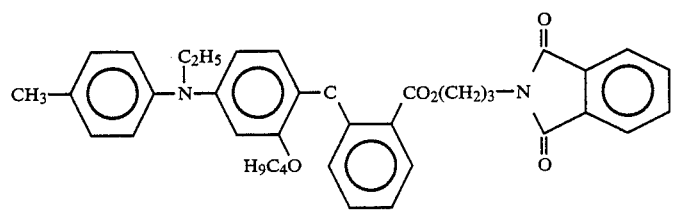

To 90 g of the obtained solution was added 1.8 g of the following development accelerator (Nissan Nonion NS208.5 of Nippon Oils And Fats Co., Ltd.). To the resulting solution was further added a a solution obtained by dissolving 0.01 g of the following mercapto compound, 6.1 g of the following reducing agent (I) and 6.45 g of the following reducing agnet (II) in 20 g of methylene chloride, to prepare an oily liquid.

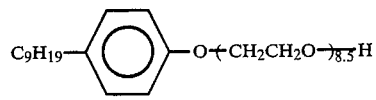

(Mercapto compound)

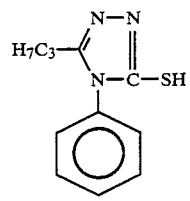

(Reducing agent (I))

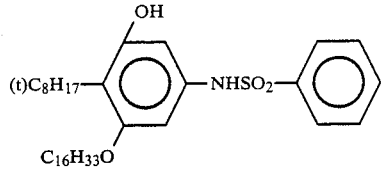

(Reducing agent (II))

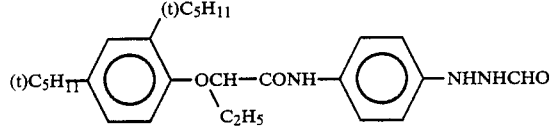

To 10 g of the above-obtained silver halide emulsion (A-1) was added 1.5 ml of a 10% aqueous solution of potassium bromide to prepare an aqueous liquid. To the resulting mixture containing the silver halide emulsion was added the above-obtained oily liquid, and the mixture was stirred at 15,000 r.p.m. for 5 minutes using a homogenizer to obtain a light-sensitive composition (A-1) composed of a W/O emulsion.

Preparation of ligh-sensitive composition (A-2)

The procedures for preparing the light-sensitive composition (A-1) described above were repeated except for using the above-obtained silver halide emulsion (A-2) instead of the silver halide emulsion (A-1) in the same amount, 20 g of the following magenta image forming substance instead of the yellow image forming substance and 0.015 g of the above-mentioned mercapto compound, to prepare a light-sensitive composition (A-2).

(Magenta image forming substance)

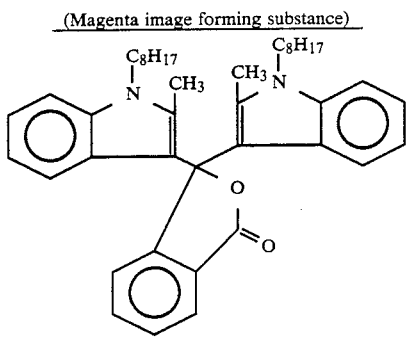

Preparation of light-sensitive composition (A-3)

The procedures for preparing the light-sensitive composition (A-1) described above were repeated except for using the above-obtained silver halide emulsion (A-3) instead of the silver halide emulsion (A-1) in the same amount, 16 g of the following cyan image forming substance instead of the yellow image forming substance and 0.0075 g of the above-mentioned mercapto compound, to prepare a light-sensitive composition (A-3).

(Cyan image forming substance)

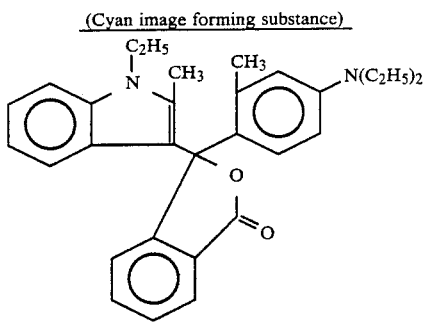

Preparation of light-sensitive microcapsule dispersion (A-1)

To the above-obtained light-sensitive composition (A-1) was added 4.5 g of a polyisocyanate compound (Takenate D110N of Takeda Chemical Industries, Ltd.). The resulting mixture was added to 208 g of a 10% aqueous solution of partical sodium salt of polyvinylbenzene sulfonic acid (trade name: VERSA TL-502, available from National Starch, Co.) having been adjusted to pH 6.0 using a 20% of aqueous solution of phosphoric acid or a 10% aqueous solution of sodium hydroxide. The resulting mixture was heated to 40° C.

and stirred at 9,000 r.p.m. for 30 minutes using a homogenizer to obtain a W/O/W emulsion.

Independently, to 51.8 g of melamine were added 85.5 g of a 37% aqueous solution of formaldehyde and 279 g of water, and the resulting mixture was stirred at 60° C. for 30 minutes to give a transparent melamine-formaldehyde precondensate.

To the above-obtained W/O/W emulsion was added 60 g of the above-obtained precondensate, and the resulting mixture was adjusted to pH 6.0 using a 20% aqueous solution of phosphoric acid under stirring. The mixture was then heated to 60° C. and stirred for 90 minutes, to obtain a light-sensitive microcapsule dispersion (A-1) containing microcapsules having polyurea resin-melamine formaldehyde resin shell.

Further, for removing the remaining formaldehyde in the microcapsule dispersion, the dispersion was added with 27 g of a 40% aqueous solution of urea. The resulting mixture was then adjusted to pH 3.5 using a 20% aqueous solution of phosphoric acid and stirred for 40 minutes. After the reaction was completed, the microcapsule dispersion was adjusted to pH 6.5 using a 10% aqueous solution of sodium hydroxide, and the dispersion was cooled. The mean particle diameter of the obtained microcapsules was 8 $\mu$m.

Preparation of light-sensitive microcapsule dispersion (A-2)

The procedures for preparing the light-sensitive microcapsule dispersion (A-1) were repeated except for using the light-sensitive composition (A-2) instead of the light-sensitive composition (A-1), to prepare a light-sensitive microcapsule dispersion (A-2). The mean particle diameter of the obtained microcapsules was 8 $\mu$m.

Preparation of light-sensitive microcapsule dispersion (A-3)

The procedures for preparing the light-sensitive microcapsule dispersion (A-1) were repeated except for using the light-sensitive composition (A-3) instead of the light-sensitive composition (A-1), to prepare a light-sensitive microcapsule dispersion (A-3). The mean particle diameter of the obtained microcapsules was 8 $\mu$m.

Preparation of light-sensitive material (A)

To the above-obtained microcapsule dispersions (A-1), (A-2) and (A-3) (each: 15 g) were added 4 g of a 5% aqueous solution of surface active agent (Nissan Nonion NS208.5 of Nippon Fats And Oils Co., Ltd.), 5 g of a 10% aqueous solution of gelatin, 0.5 ml of a 2% aqueous solution of 1,2-bis(vinylsulfonylacetamide)ethane and 10 g of a 10% aqueous solution of sodium hydrogencarbonate. To the resulting mixture was added water to give 97 g of a coating solution for the formation of a light-sensitive layer.

The coating solution was coated over polyethylene terephthalate film in an amount of 48 g/m² to give a coated layer on the film, and the coated layer was dried at approx. 40° C. to prepare light-sensitive materials (A).

Preparation of image-receiving material

To 125 g of water was added 11 g of a 40% aqueous solution of sodium hexametaphosphate, and to the mixture were further added 34 g of zinc 3,5-di-α-methyl-benzyl-salicylate and 82 g of a 55% slurry of calcium carbonate, followed by coarsely dispersing in a mixer. The resulting coarse dispersion was then finely dispersed in Dynomill dispersing device. To 200 g of the resulting dispersion was added 112 g of an 8% aqueous solution of polyvinyl alcohol, and the resulting mixture was made uniform. The mixture was further added with 70 g of water to give a coating solution for the formation of an image-receiving layer. The coating solution was evenly coated on a paper support having basis weight of 55 g/m² (a support of a paper sheet having such a fiber length distribution that the total of the amount of 24-mesh residue (wt.%) and the amount of 42-mesh rsidue (wt.%) is in the range of 30 to 60% as the fiber length distribution determined by JIS-P-8207) in an amount of 58 g/m², and the coated layer was dried at 60° C. to prepare an image-receiving material.

Image-formation and evaluation thereof

The light-sensitive material obtained above was subjected to the following imagewise exposure and development process under three humidity conditions of 80%, 50 % and 30% (relative humidity, image-formation (1), (2) and (3), respectively).

The light-sensitive material was exposed to light using a tungsten lamp at 2,000 lux for 1 second through a continuous filter having a transmission density of 0 to 4.0. Then, the light-sensitive material was coated with water in an amount of 5 g/m² (i.e., approx. 100 wt.% based on the amount of the polymerizable compound). As a result, water permeated the light-sensitive layer. Keeping this state, the light-sensitive layer was heated to 90° C. for 10 seconds using a hot plate.

Subsequently, the light-sensitive material was combined with the above-obtained image-receiving material at room temperature (20° C.) and 50%RH, and they were pressed through a press roller at a pressure of 500 kg/cm². When the light-sensitive material was separated from the image-receiving material, a black positive image was obtained on the image-receiving material.

In the above-mentioned image-forming method, an exposure amount (lux.second) required for making the density of the obtained image 0.5 was measured, and the exposure amount was determined as the sensitivity of the method.

For comparison, the same measurement as described above was done in the case where the above-mentioned coating procedure of water was not carried out (image-forming methods (4)–(6)) and the case where the above-mentioned coating procedure of water was not carried out and the heating temperature was varied to 120° C. (image-forming methods (7)–(9)).

The results are set forth in Table 1.

TABLE 1

| Image Formation | Water | Relative Humidity | Heating Temp. | Sensitivity (lux · second) |
|---|---|---|---|---|
| (1) | coated | 80% | 90° C. | 10 |
| (2) | coated | 50% | 90° C. | 10 |
| (3) | coated | 30% | 90° C. | 10 |
| (4) | not coated | 80% | 90° C. | 500 |
| (5) | not coated | 50% | 90° C. | wholly colored |
| (6) | not coated | 30% | 90° C. | wholly colored |
| (7) | not coated | 80% | 120° C. | 50 |
| (8) | not coated | 50% | 120° C. | 500 |
| (9) | not coated | 30% | 120° C. | wholly colored |

As is evident from the results set forth in Table 1, in the case of coating water on the light-sensitive layer according to the image-forming method of the invention, the sensitivity was fixed independent of the relative humidity. Further, when water was coated on the light-sensitive layer according to the invention, the sensitivity becomes high even under heating at a low temperature (90° C.).

EXAMPLE 2

Preparation of base solution

In 100 ml of water was dissolved 7.5 g of guanidine carbonate to prepare a solution (A), and in 100 ml of water was dissolved 3.5 g of diethanol amine to prepare a solution (B). Likewise, 10 g of guanidine trichloroacetic acid was dissolved in 100 ml of water-ethanol solution (water/ethanol=50/50) to prepare a solution (C).

Preparation of silver halide emulsion

In 1,000 ml of water were dissolved 20 g of gelatin and 3 g of sodium chloride, and the resulting gelatin solution was kept at 75° C. To the gelatin solution, 600 ml of an aqueous solution containing 21 g of sodium chloride and 71 g of potassium bromide and 600 ml of an aqueous solution containing 0.59 mole of silver nitrate were added simultaneously at the same feed rate over 40 minutes. Thus, a silver chlorobromide monodisperse emulsion (bromine: 80 mole %) containing 14-hedral silver chlorobromide grains having an average grain size of 0.35 μm.

The emulsion was washed with water for desalting, and then added with 5 mg of sodium thiosulfate and 20 mg of 4-hydroxy-6-methyl-1,3,3a,7-tetrazaindene to perform chemical sensitization at 60° C. The yield of the emulsion was 600 g.

Preparation of benzotriazole silver emulsion

In 3,000 ml of water were dissolved 28 g of gelatin and 13.2 g of benzotriazole. Keeping the resulting solution at 40° C. under stirring, 100 ml of an aqueous solution containing 17 g of silver nitrate was added to the solution over 2 minutes. The pH of the obtained emulsion was adjusted to precipitate the excess salt, and the excess salt was removed from the emulsion. The emulsion was then adjusted to pH 6.3 to obtain a benzotriazole silver emulsion. The yield of the emulsion was 400 g.

Preparation of light-sensitive composition

In 100 g of trimethylolpropan etriacrylate were dissolved 0.40 g of the following copolymer, 6.00 g of Pargascript Red I-6-B (tradename of Ciba-Geigy) and 2 g of Emalex NP-8 (tradename of Nippon Emulsion co., Ltd.). In 18.00 g of the obtained solution was dissolved 0.002 g of the following mercapto compound. To the resulting solution was added a solution obtained by dissolving 0.16 g of the following hydrazine derivative (reducing agent) and 1.22 g of the following developing agent (reducing agent) in 1.80 g of methylene chloride. To the obtained solution were then added 2.0 g of the above-prepared silver halide emulsion and 0.5 g of the above-prepared benzotriazole silver emulsion, and they were stirred at 15,000 r.p.m. for 5 minutes using a homogenizer, to prepare a light-sensitive composition.

(Copolymer)

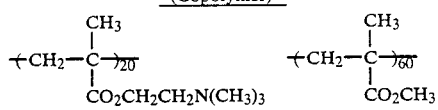

-continued

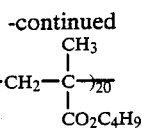

(Mercapto compound)

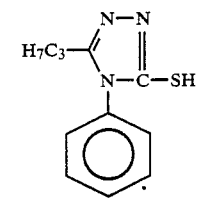

(Hydrazine derivative)

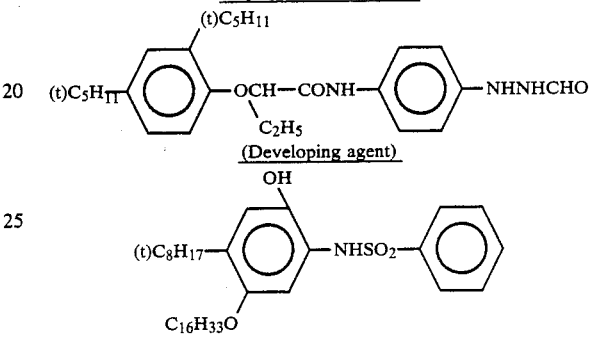

Preparation of microcapsule dispersion

To 10.51 g of a 18.6% aqueous solution of isobane (available from Kurare Co., Ltd.) was added 48.56 g of a 2.89% aqueous solution of pectine, and the mixture was adjusted to pH 4.0 using a 10% aqueous solution of sufuric acid. To the mixture was then added the above-obtained light-sensitive composition and stirred at 7,000 r.p.m. for 2 minutes using a homogenizer, to emulsify the light-sensitive composition in the aqueous medium.

To 72.5 g of the obtained aqueous emulsion were successively added 8.32 g of a 40% aqueous solution of urea, 2.82 g of a 11.3% aqueous solution of resolcin, 8.56 g of a 37% aqueous solution of formalin and 2.74 g of a 8.76% aqueous solution of ammonium sulfate. The resulting mixture was heated at 60° C. for 2 hours under stirring, and the mixture was then adjusted to pH 7.0 using a 10% aqueous solution of sodium hydroxide. The mixture was then added with 3.62 g of a 30.9% aqueous solution of sodium bisulfate, and the mixture was further adjusted to pH 6.0 using a 10% sulfuric acid. Thus, a microcapsule dispersion was prepared.

Preparation of light-sensitive material

To 10.0 g of the above-obtained microcapsule dispersion were added 2.5 g of a 10% aqueous solution of gelatin, 0.2 ml of 2% aqueous solution of 1,2-bis (vinyl-sulfonylacetamide)ethane and 1.0 g of a 1% aqueous solution of the following anionic surface active agent, to prepare a coating solution for the formation of a light-sensitive layer.

(Anionic surface active agent)

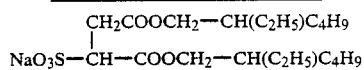

The coating solution was coated on a polyethylene terephthalate sheet of 100 μm thick to give a coated layer having a wet thickness of 60 μm on the sheet, and the coated layer was dried at approx. 40° C. to prepare a light-sensitive material (T-1).

Preparation of image-receiving material

To 125 g of water was added 11 g of a 40% aqueous solution of sodium hexametaphosphate, and to the mixture were further added 34 g of zinc 3,5-di-α-methyl-benzyl-salicylate and 82 g of a 55% slurry of calcium carbonate, followed by coarsely dispersing in a mixer. The resulting coarse dispersion was then finely dispersed in Dynomill dispersing device. To 200 g of the resulting dispersion were added 6 g of 50% SBR latex and 55 g of an 8% aqueous solution of polyvinyl alcohol, and the resulting mixture was made uniform. The obtained mixture was evenly coated on an art paper having basis weight of 43 g/m$^2$ to give a coated layer having a wet thickness of 30 μm, and the coated layer was dried to prepare an image-receiving material.

Image-formation and evaluation thereof

The light-sensitive material (T-1) was exposed to light using a tungsten lamp at 200 lux for 1 second through a wadge having continuously varied density. Then, the light-sensitive material was wetted with the above-prepared base solutions (A), (B) and (C) in an amount of 10 ml/m$^2$, respectively, to obtain base-containing light-sensitive materials (A), (B) and (C). Each of the light-sensitive materials was then combined with the above-obtained image-receiving material in such a manner that the light-sensitive layer faced the surface of the image-receiving material. Keeping this state, the light-sensitive material was heated at 150° C. for 10 seconds using a hot plate.

Subsequently, each of the light-sensitive material (T-1) with the image-receiving material pressed through a press roller at a pressure of 500 kg/cm$^2$. When the light-sensitive material was separated from the image-receiving material, a magenta positive image of high sharpness was obtained on the image-receiving material. The density on the surface of the image-receiving material corresponding each of the light-sensitive materials (A), (B) and (C) was measured using Macbeth reflection densitometer (RD-519).

Further, each of the light-sensitive materials was stored for 3 days in a constant temperature bath having an inside temperature of 50° C. Then, an image was formed on the imag-receiving material in the same manner as described above, and the density on the surface of the image-receiving material was measured.

The results are set forth in Table 2 (described later).

EXAMPLE 3

Preparation of base sheet

To 30 g of a 10% aqueous solution of gelatin was added 0.80 g of guanidine carbonate and 70 ml of water. The resulting solution was coated over a polyethylene terephthalate sheet of 100 μm thick to give a coated layer having a wet thickness of 70 μm. The coated layer was dried to prepare a base sheet (S-1).

The above procedure was repeated except for using 1.4 g of guanidine trichloroacetate and 3.0 g of polyethylene glycol (molecular weight: 2,000) instead of 0.80 g of guanidine carbonate, to prepare a base sheet (S-2).

Image-formation and evaluation thereof

The light-sensitive material prepared in Example 2 was exposed to light using a tungsten lamp at 200 lux for 1 second through a wadge having continuously varied density. Then, the light-sensitive layer of the light-sensitive material was wetted with water in an amount of 10 ml/m$^2$. The light-sensitive layer was then brought into close contact with each of the above-obtained base sheets (S-1) and (S-2), and heated at 100° C. for 10 seconds on a hot plate. After the light-sensitive material was separated from the base sheet, the light-sensitive material was combined with the image-receiving material used in Example 2. The light-sensitive material with the image-receiving material pressed through a press roller at a pressure of 500 kg/cm$^2$. When the light-sensitive material was separated from the image-receiving material, a magenta positive image of high sharpness was obtained on the image-receiving material. The density on the surface of the image-receiving material was measured using Macbeth reflection densitometer.

Further, the light-sensitive material was stored for 3 days in a constant temperature bath having an inside temperature of 50° C. Then, an image was formed on the imag-receiving material in the same manner as described above, and the density on the surface of the image-receiving material was measured.

The results are set forth in Table 2 (described later).

COMPARISON EXAMPLE 1

Preparation of light-sensitive material

To 10.0 g of the microcapsule dispersion prepared in Example 2 were added 2.5 g of a 10% aqueous solution of gelatin, 1.0 g of a 1% aqueous solution of anionic surface active agent used in Example 2 and 0.22 g of guanidine carbonate. The resulting solution was coated over a polyethylene terephthalate sheet of 100 μm thick to give a coated layer having a wet thickness of 60 μm on the sheet. The coated layer was dried at approx. 40° C., to prepare a light-sensitive material (D).

The above procedure was repeated except for using 0.38 g of guanidine trichloroacetic acid instead of 0.22 g of guanidine carbonate, to prepare a light-sensitive material (E).

Image-formation and evaluation thereof

Each of the above-obtained light-sensitive materials was exposed to light using a tungsten lamp at 200 lux for 1 second through a wadge having continuously varied density. Then, each of the light-sensitive material was heated at 100° C. for 10 seconds on a hot plate. Thereafter, the light-sensitive material was combined with the image-receiving material used in Example 2, and the light-sensitive material with the image-receiving material was pressed through a press roller at a pressure of 500 kg/cm$^2$. When the light-sensitive material was separated from the image-receiving material, a magenta positive image of high sharpness was obtained on the image-receiving material. The density on the surface of the image-receiving material was measured using Macbeth reflection densitometer.

Further, each of the light-sensitive materials was stored for 3 days in a constant temperature bath having an inside temperature of 50° C. Then, an image was formed on the imag-receiving material in the same manner as described above, and the density on the surface of the image-receiving material was measured.

The results are set forth in Table 2 (described later).

COMPARISON EXAMPLE 2

The procedure of image formation in Example 3 was repeated except for not wetting the light-sensitive layer with water to form an image on the image-receiving material. The density on the surface of the image-receiving material was measured in the same manner as described in Example 3.

The results of Examples 2 and 3 and Comparison Examples 1 and 2 are set forth in Table 2.

TABLE 2

| Image Formation | Water | Light-sensitive Material | Base Sheet | Just After Preparation | | After Storage | |
|---|---|---|---|---|---|---|---|
| | | | | Dmin | Dmax | Dmin | Dmax |
| Ex. 2 | wetted | (A) | none | 0.05 | 1.30 | 0.08 | 1.30 |
| Ex. 2 | wetted | (B) | none | 0.05 | 1.26 | 0.08 | 1.28 |
| Ex. 2 | wetted | (C) | none | 0.45 | 1.30 | 0.48 | 1.30 |
| Ex. 3 | wetted | (T-1) | (S-1) | 0.05 | 1.30 | 0.10 | 1.30 |
| Ex. 3 | wetted | (T-1) | (S-2) | 0.40 | 1.30 | 0.46 | 1.30 |
| Com. Ex. 1 | none | (D) | none | 0.70 | 1.30 | 1.30 | 1.30 |
| Com. Ex. 1 | none | (E) | none | 1.00 | 1.30 | 1.30 | 1.30 |
| Com. Ex. 2 | none | (T-1) | (S-1) | 0.90 | 1.30 | 0.92 | 1.30 |
| Com. Ex. 2 | none | (T-1) | (S-2) | 1.10 | 1.30 | 1.08 | 1.30 |

As is evident from the results set forth in Table 2, the image-forming method of the invention gave an image of high sharpness and high smoothness which had a high maximum density and a low minimum density even at a low developing temperature. Further, it has been confirmed that an excellent positive image having a low minimum density was obtained even after storage of the light-sensitive material under severe conditions.

EXAMPLE 4

Preparation of silver halide emulsion

In 1,200 ml of water were dissolved 25 g of gelatin and 3 g of sodium chloride, and the resulting gelatin solution was kept at 70° C. To the gelatin solution, 600 ml of an aqueous solution containing 117 g of potassium bromide and 600 ml of an aqueous solution containing 0.74 mole of silver nitrate were added simultaneously at the same feed rate over 45 minutes. After 5 minutes, to the resulting mixture was added 200 ml of an aqueous solution containing 4.3 g of potassium iodide over 5 minutes. The obtained emulsion was washed with water for desalting, and then added with 24 g of gelatin. The obtained emulsion was stirred at 50° C. for 15 minutes to obtain a silver halide emulsion. The yield of the emulsion was 1,000 g.

Preparation of light-sensitive composition

In 100 g of trimethylolpropane triacrylate were dissolved 0.4 g of the following copolymer and 10 g of Pargascript Red I-6-B (tradename of Ciba-Geigy). To the resulting solution was added 18 g of a surface active agent (Nissan Nonion NS208.5 of Nippon Oils And Fats Co., Ltd.), and to the resulting solution was added a solution obtained by dissolving 1.29 g of the following hydrazine derivative (reducing agent (I)), 1.22 g of the following developing agent (reducing agent (II)), 0.003 g of the following mercapto compound and 0.018 g of the following development inhibitor-releasing precursor in 4 g of methylene chloride, to prepare an oily liquid.

Independently, to 2.0 g of the above-obtained silver halide emulsion was added 0.45 g of a 10% aqueous solution of potassium bromide, to prepare an aqueous liquid.

Subsequently, to the above-obtained oily liquid was added the aqueous liquid, and they were stirred at 15,000 r.p.m. for 5 minutes, to obtain a light-sensitive composition composed of a W/O emulsion.

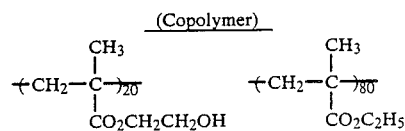
(Copolymer)

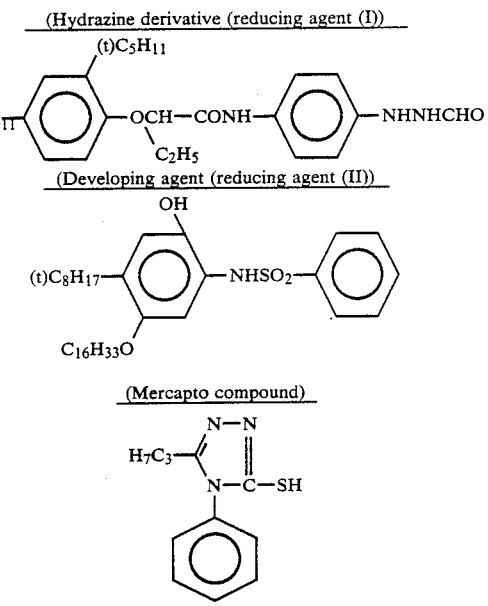

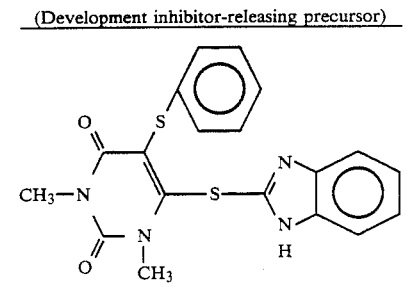

Preparation of microcapsule dispersion

A 5% aqueous solution of partial sodium salt of polyvinylbenzene sulfonic acid (trade name: VERSA TL-502, available from National Starch, Co.) was adjusted to pH 3.5 using a 20% of aqueous solution of phosphoric acid. To 40 g of the solution was added a homogeneous mixture of 0.9 g of the above-obtained light-sensitive composition and 0.9 g of a polyisocyanate compound (Takenate D110N of Takeda Chemical Industries, Ltd.). The resulting mixture was heated to 40° C. and stirred at 7,000 r.p.m. for 30 minutes using a homogenizer to obtain a W/O/W emulsion.

Independently, to 13.2 g of melamine were added 21.6 g of a 37% aqueous solution of formaldehyde and 70.8 g of water, and the resulting mixture was stirred at 60° C. for 30 minutes to give a transparent melamine-formaldehyde precondensate.

10 g of the above-obtained precondensate was added to the above-obtained W/O/W emulsion, and the resulting mixture was adjusted to pH 6.0 using a 20% aqueous solution of phosphoric acid under stirring. The mixture was then heated to 65° C. and stirred for 90 minutes, to obtain a light-sensitive microcapsule dispersion containing microcapsules having polyurea resin-melamine formaldehyde resin shell.

Further, for removing the remaining formaldehyde in the microcapsule dispersion, the dispersion was added with 5.4 g of a 40% aqueous solution of urea. The resulting mixture was then adjusted to pH 3.5 using a 20% aqueous solution of phosphoric acid and stirred for 40 minutes. After the reaction was completed, the microcapsule dispersion was adjusted to pH 7.0 using a 10% aqueous solution of sodium hydroxide, and the dispersion was cooled.

Thus, a microcapsule dispersion containing microcapsules having polyurea resin-melamine formaldehyde resin shell.

Preparation of light-sensitive material

To 10.0 g of the above-obtained microcapsule dispersion were added 2.5 g of a 10% gelatin solution, 10 ml of water, 1 ml of a 5% aqueous solution of the following nonionic surface active agent and 0.3 ml of a 2% aqueous solution of 1,2-bis(vinylsufonylacetamide)ethane, to prepare a coating solution for the formation of a light-sensitive layer.

(Nonionic surface active agent)

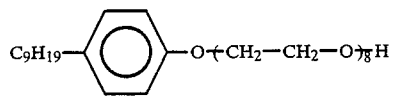

The coating solution was coated on a polyethylene terephthalate sheet of 100 μm thick to give a coated layer having a wet thickness of 60 μm on the sheet, and the coated layer was dried at approx. 40° C. to prepare a light-sensitive material (T-2).

Preparation of base sheet

To 30 g of a 10% aqueous solution of gelatin were added 0.80 g of guanidine carbonate, 3.0 g of polyethylene glycol (molecular weight: 2,000), 2.3 ml of a 2% aqueous solution of 1,2-bis(vinylsulfonylacetamide) ethane and 80 ml of water. The resulting solution was coated over a polyethylene terephthalate sheet of 100 μm thick to give a coated layer having a wet thickness of 70 μm. The coated layer was dried at approx. 40° C. to prepare a base sheet (S-3).

Image-formation and evaluation thereof

The light-sensitive material prepared as above was exposed to light using a tungsten lamp at 200 lux for 1 second through a script havig maximum transmission density of 4.0 and minimum transmission density of 0.1. Then, the light-sensitive layer of the light-sentive material was coated with water in an amount of 0.05 g, 0.1 g, 1 g and 10 g, per 1 m², respectively. Each of thus treated light-sensitive layer was then brought into close contact with the above-obtained base sheet (S-3), and heated at 100° C. for 10 seconds using a heating device of belt drive roller type. After the light-sensitive material was separated from the base sheet, the light-sensitive material was combined with the image-receiving material used in Example 2. The light-sensitive material with the image-receiving material was pressed through a press roller at a pressure of 500 kg/cm². When the light-sensitive material was separated from the image-receiving material, a magenta positive image was obtained on the image-receiving material. The density on the surface of the image-receiving material was measured using Macbeth reflection densitometer.

Further, the light-sensitive layer was measured on the swelling condition with water using a swelling thickness measuring device to determine the maximum swelling volume of the light-sensitive material. As a result, the light-sensitive layer reached its maximum swelling thickness within approx. 5 seconds, and the thickness of the light-sensitive layer increased by almost 10 μm.

Separately, the light-sensitive layer of the light-sensitive material was immersed in water for approx. 10 seconds, and the excess water on the surface of the light-sensitve layer was wiped out therefrom. Then, the weight of the light-sensitive material was measured. From the difference of the weight between before and after the immersion in water, it was confirmed that the light-sensitive layer was impregnated with water in an amount of approx. 10 g per 1 m². Accordingly, the maximum swelling volume of the light-sensitive layer was determined as 10 ml (10 g) per 1 m².

The results are set forth in Table 3, in which the terms "amount of water per valume" means a value calculated by the formula of [(amount of coated water)÷((maximum swelling volume)×100 ].

TABLE 3

| Amount of Water | | Reflection Density of Image | |
|---|---|---|---|
| per 1 m² | per volume | Max. Density | Min. Density |
| 0 g | 0% | 1.35 | 0.50 |
| 0.05 g | 0.5% | 1.35 | 0.35 |
| 0.1 g | 1% | 1.35 | 0.10 |
| 1 g | 10% | 1.33 | 0.07 |
| 10 g | 100% | 1.30 | 0.06 |
| 20 g | 200% | 1.00 | 0.06 |

As is evident from the results set forth in Table 3, when the heat development process was conducted under keeping the amount of water in the range of approx. 1 to 100% of water corresponding to the maximum swelling volume of the light-sensitive layer prior to coating of water, an uniform image having high maximum density and low minimum density was obtained. Further, it was confirmed that the minimum density of the image was high in the case of coating water in a small amount and the maximum density was low in the case of coating water in a large amount.

EXAMPLE 5

Preparation of silver halide emulsion (B-1) (blue-sensitive)

In 1,200 ml of water were dissolved 24 g of gelatin and 1.2 g of sodium chloride, and the resulting gelatin solution was adjusted to pH 3.2 using 1N-sulfuric acid and kept at 60° C. To the gelatin solution, 600 ml of an aqueous solution containing 117 g of potassium bromide and 600 ml of an aqueous solution containing 0.74 mole of silver nitrate were added simultaneously at the same feed rate over 45 minutes. After 5 minute, to the resulting mixture was added 200 ml of an aqueous solution containing 4.3 g of potassium iodide at the same feed rate over 5 minutes. To the resulting emulsion was added 1.2 g of poly(isobutylene-comaleic acid monosodium) to perform precipitation, and the emulsion was washed with water for desalting. Then, to the emulsion was successively added 24 g of gelatin, 5 mg of sodium thiosulfate and 0.5 g of the following sensitizing dye (a) to perform chemical sensitization at 60° C. for 15 minutes, to obtain a silver halide emulsion (B-1). The yield of the emulsion was 1,000 g.

(Sensitizing dye (a))

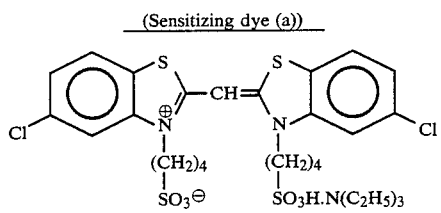

Preparation of silver halide emulsion (B-2) (green-sensitive)

In 1,200 ml of water were dissolved 24 g of gelatin and 1.2 g of sodium chloride, and the resulting gelatin solution was adjusted to pH 3.2 using 1N-sulfuric acid and kept at 60° C. To the gelatin solution, 600 ml of an aqueous solution containing 117 g of potassium bromide and 600 ml of an aqueous solution containing 0.74 mole of silver nitrate were added simultaneously at the same feed rate over 45 minutes. After 5 minute, to the resulting mixture was added 200 ml of an aqueous solution containing 4.3 g of potassium iodide at the same feed rate over 5 minutes. To the resulting emulsion was added 1.2 g of poly(isobutylene-comaleic acid monosodium) to perform precipitation, and the emulsion was washed with water for desalting. Then, to the emulsion was successively added 24 g of gelatin, 5 mg of sodium thiosulfate and 0.47 g of the following sensitizing dye (b) to perform chemical sensitization at 60° C. for 15 minutes, to obtain a silver halide emulsion (B-2). The yield of the emulsion was 1,000 g.

Preparation of silver halide emulsion (B-3) (red-sensitive)

In 1,200 ml of water were dissolved 24 g of gelatin and 1.2 g of sodium chloride, and the resulting gelatin solution was adjusted to pH 3.5 using 1N-sulfuric acid and kept at 60° C. To the gelatin solution, 600 ml of an aqueous solution containing 117 g of potassium bromide and 600 ml of an aqueous solution containing 0.74 mole of silver nitrate were added simultaneously at the same feed rate over 45 minutes. After 5 minute, to the resulting mixture was added 200 ml of an aqueous solution containing 4.3 g of potassium iodide at the same feed rate over 5 minutes. To the resulting emulsion was added 1.2 g of poly(isobutylene-comaleic acid monosodium) to perform precipitation, and the emulsion was washed with water for desalting. Then, to the emulsion was successively added 24 g of gelatin, 5 mg of sodium thiosulfate and 0.47 g of the following sensitizing dye (c) to perform chemical sensitization at 60° C. for 15 minutes, to obtain a silver halide emulsion (B-3). The yield of the emulsion was 1,000 g.

Sensitizing dye (c))

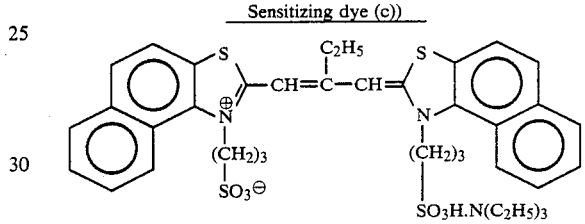

Preparation of light-sensitive composition (B-1)

In 50 g of the following polymerizable compound were dissolved 0.4 g of the following copolymer and 5 g of the following color image forming substance (a).

(Polymerizable compound)

$C_2H_5C(-CH_2OC_3H_6OCOCH=CH_2)_3$

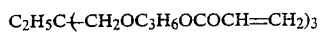

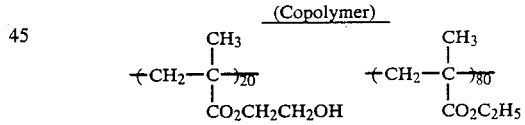

Color image forming substance (a))

(Sensitizing dye (b))

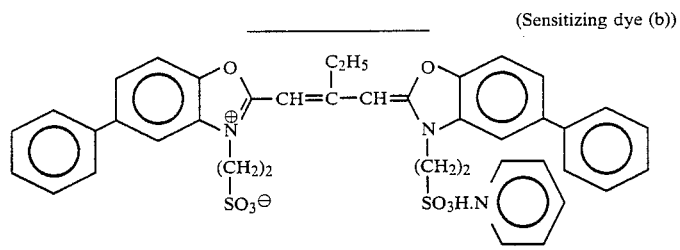

-continued

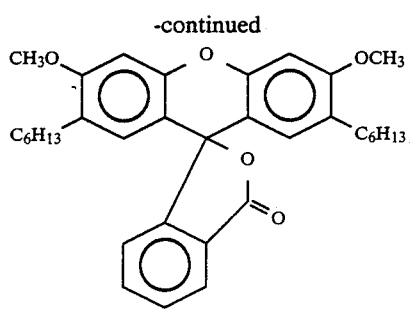

To the obtained solution were added 3.9 g of the following hydrazine derivative, 3.7 g of the following reducing agent, 0.05 g of the following development inhibitor-releasing precursor, 0.008 g of the following mercapto compound, 1 g of the following surface active agent and 10 g of methylene chloride, to prepare an oily liquid.

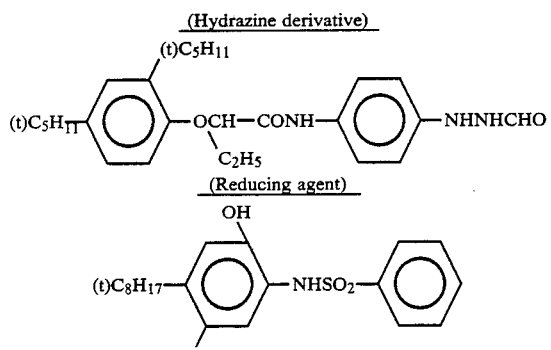

(Development inhibitor-releasing precursor)

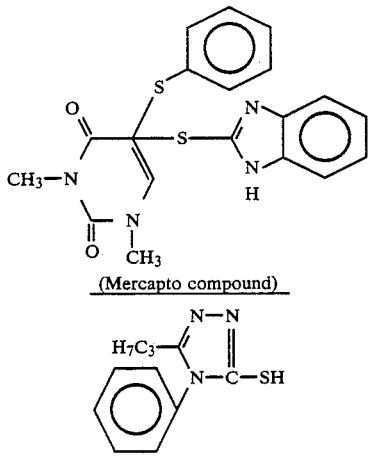

(Nonionic surface active agent)

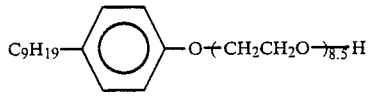

Further, to the oily liquid were added 6.0 g of the above-obtained silver halide emulsion (B-1) and 1.4 g of a 10% aqueous solution of potassium bromide. The resulting mixture was stirred at 15,000 r.p.m. for 5 minutes using a homogenizer to obtain a light-sensitive composition (B-1) containing the silver halide emulsion emulsified in the oily liquid.

Preparation of light-sensitive composition (B-2)

In 50 g of the above polymerizable compound were dissolved 0.4 g of the above copolymer and 5 g of the following color image forming substance (b).

(Magenta image forming substance)

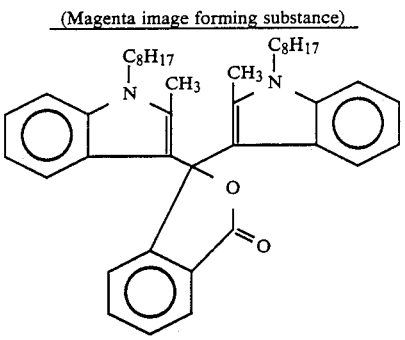

To the obtained solution were added 3.9 g of the above hydrazine derivative, 3.7 g of the above reducing agent, 0.05 g of the above development inhibitor-releasing precursor, 0.008 g of the above mercapto compound, 1 g of the above surface active agent and 10 g of methylene chloride, to prepare an oily liquid. To the oily liquid were added 6.0 g of the above-obtained silver halide emulsion (B-2) and 1.4 g of a 10% aqueous solution of potassium bromide. The resulting mixture was stirred at 15,000 r.p.m. for 5 minutes using a homogenizer to obtain a light-sensitive composition (B-2) containing the silver halide emulsion emulsified in the oily liquid.

Preparation of light-sensitive composition (A-3)

In 50 g of the above polymerizable compound were dissolved 0.4 g of the above copolymer and 5 g of the following color image forming substance (c).

(Cyan image forming substance)

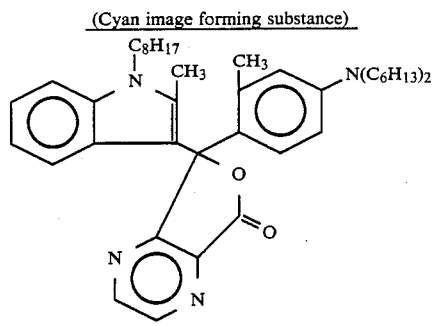

To the obtained solution were added 3.9 g of the above hydrazine derivative, 3.7 g of the above reducing agent, 0.05 g of the above development inhibitor-releasing precursor, 0.008 g of the above mercapto compound, 1 g of the above surface active agent and 10 g of methylene chloride, to prepare an oily liquid. To the oily liquid were added 6.0 g of the above-obtained silver halide emulsion (B-3) and 1.4 g of a 10% aqueous solution of potassium bromide. The resulting mixture was stirred at 15,000 r.p.m. for 5 minutes using a homogenizer to obtain a light-sensitive composition (B-3) containing the silver halide emulsion emulsified in the oily liquid.

Preparation of light-sensitive microcapsule dispersion (B-1)

In the above-obtained light-sensitive composition (B-1) was dissolved 2.7 g of an isocyanate compound (Takenate D110N of Takeda Chemical Industries, Ltd.). To the resulting solution was added 125 g of a 10% aqueous solution of a polymer (trade name: VERSA TL-502, available from National Starch, Co.). The resulting mixture was heated to 40° C. and stirred at 9,000 r.p.m. for 30 minutes using a homogenizer to emulsify the light-sensitive composition (B-1) in the aqueous medium.

Independently, to 34.5 g of melamine were added 57 g of a 37% aqueous solution of formaldehyde and 186 g of water, and the resulting mixture was stirred at 600 r.p.m. at 60° C. for 30 minutes to give a melamine-formaldehyde precondensate.

To the above-obtained aqueous emulsion was added 36 g of the melamine-formaldehyde precondensate under stirring the emulsion at 1,200 r.p.m. at 25° C., and the resulting mixture was adjusted to pH 6.0. The mixture was then heated to 60° C. and stirred at 1,200 r.p.m. for 90 minutes. Thereafter, the mixture was adjusted to pH 3.5 by adding 16 g of a 40% aqueous solution of urea. The obtained dispersion was stirred at 1,000 r.p.m. at 60° C. for 40 minutes and adjusted to pH 7.0. Thus, a light-sensitive microcapsule dispersion (B-1) was prepared.

Preparation of light-sensitive microcapsule dispersion (B-2)

The procedures for preparing the above-mentioned light-sensitive microcapsule dispersion (B-1) were repeated except for using the light-sensitive composition (B-2) instead of the light-sensitive composition (B-1), to prepare a light-sensitive microcapsule dispersion (B-2).

Preparation of light-sensitive microcapsule dispersion (B-3)

The procedures for preparing the above-mentioned light-sensitive microcapsule dispersion (B-1) were repeated except for using the light-sensitive composition (B-3) instead of the light-sensitive composition (B-1), to prepare a light-sensitive microcapsule dispersion (B-3).

Preparation of light-sensitive material

To each of the light-sensitive microcapsule dispersions (B-1), (B-2) and (B-3), (each: 5 g), were added 7 g of a 10% gelatin solution, 6 ml of a 5% aqueous solution of the aforementioned nonionic surface active agent, 1 ml of a 2% aqueous solution of 1,2-bis(vinylsulfonylacetamide)ethane and 38 g of water, to prepare a coating solution for the formation of a light-sensitive layer.

The coating solution was coated over a polyethylene terephthalate sheet to give a coated layer having a wet thickness of 50 μm, and the coated layer was dried to prepare a light-sensitive material (T-3).

Preparation of base solution

In 100 g of water was dissolved 8 g of guanidine carbonate (A), 4.3 g of sodium metaborate (B), 6.6 g of potassium hydrogencarbonate (C) and 11.5 g of potassium dihydrogenphosphate (D), respectively, to prepare base solutions (A), (B), (C) and (D).

Image-formation and evaluation thereof

The light-sensitive material (T-3) was exposed to light using a tungsten lamp at 200 lux for 1 second through a script havig maximum transmission density of 4.0 and minimum transmission density of 0.1. Then, the light-sensitive layer of the light-sentive material was coated with each of the base solutions in an amount of 10 g. per 1 m$^2$, to obtain light-sensitive materials (T-3A), (T-3B), (T-3C) and (T-3D) corresponding to the base solutions (A), (B), (C) and (D), respectively. Each of the light-sensitive materials was combined with the image-receiving material used in Example 2, and the light-sensitive material with the image-receiving material was heated at 90° to 95° C. for 10 seconds using a heat roller and pressed through a press roller at a pressure of 500 kg/cm$^2$. When the light-sensitive material was separated from the image-receiving material, a positive image of high sharpness was obtained on the image-receiving material. The maximum density and the minimum density of each color (yellow, magenta and cyan) was measured using Macbeth reflection densitometer.

The results are set forth in Table 4 (described later).

COMPARISON EXAMPLE 3

The procedures of Example 5 were repeated except for adding 1.6 g of guanidine carbonate, 0.9 g of sodium metaborate, and 1.3 g of potassium hydrogencarbonate and 2.3 g of potassium dihydrogenphosphate, respectively, to the coating solution for the formation of a light-sensitive layer, to prepare light-sensitive materials (T-3E), (T-3F), (T-3G) and (T-3H).

Image-Formation and Evaluation Thereof

The procedure of image formation in Example 5 was repeated except for not wetting the light-sensitive layer with water to form an image on the image-receiving material. The obtained image was measured on the maximum density and the minimum density in the same manner as described in Example 5.

The results of Example 5 and Comparison Example 3 are set forth in Table 4.

TABLE 4

| Light-sensitive Material | Maximum Density | | | Minimum Density | | |
|---|---|---|---|---|---|---|
| | Yellow | Magenta | Cyan | Yellow | Magenta | Cyan |
| Example 5 | | | | | | |
| (T-3A) | 1.21 | 1.27 | 1.18 | 0.05 | 0.06 | 0.06 |
| (T-3B) | 1.22 | 1.27 | 1.18 | 0.06 | 0.06 | 0.07 |
| (T-3C) | 1.23 | 1.30 | 1.20 | 0.07 | 0.08 | 0.08 |
| (T-3D) | 1.21 | 1.27 | 1.19 | 0.06 | 0.06 | 0.06 |
| Com. Example 3 | | | | | | |
| (T-3E) | 1.23 | 1.30 | 1.20 | 0.85 | 0.80 | 0.90 |
| (T-3F) | 1.23 | 1.30 | 1.20 | 0.90 | 0.90 | 0.95 |
| (T-3G) | 1.23 | 1.30 | 1.20 | 0.95 | 0.95 | 0.95 |
| (T-3H) | 1.23 | 1.30 | 1.19 | 0.90 | 0.95 | 0.95 |

As is evident from the results set forth in Table 4, an image was formed for a short period of time even at a low developing temperature by using a small amount of water.

We claim:
1. An image-forming method which comprises the steps of:
   imagewise exposing to light a light-sensitive material comprising a support and a light-sensitive layer which contains silver halide, a reducing agent and an ethylenic unsaturated polymerizable compound, said silver halide and polymerizable compound being contained in microcapsules which are dispersed in the light-sensitive layer; and simultaneously or thereafter heating the exposed light-sensitive material at a temperature of not lower than 50° C. under such condition that the light-sensitive layer contains a liquid in an amount of 10 to 400 wt. % based on the amount of the polymerizable compound, to imagewise polymerize the polymerizable compound, said liquid being water or a hydrophilic liquid and arranged outside of the microcapsules.

2. The image-forming method as claimed in claim 1, wherein the step of heating the exposed light-sensitive material is performed at a temperature in the range of 50° C. to 100° C.

3. The image-forming method as claimed in claim 1, wherein the liquid contained in the light-sensitive layer has a melting point of not higher than 50° C.

4. The image-forming method as claimed in claim 1, wherein the liquid contained in the light-sensitive layer has a boiling point in the range of 50° to 200° C.

5. The image-forming method as claimed in claim 1, wherein the light-sensitive layer contains a hydrophilic binder.

6. The image-forming method as claimed in claim 1, wherein the liquid contained in the light-sensitive layer is water.

7. The image-forming method as claimed in claim 1, wherein the heated light-sensitive material is pressed on an image-receiving material to transfer an unpolymerized polymerizable compound to the image-receiving material.

8. The image-forming method as claimed in claim 1, wherein the step of heating the exposed light-sensitive material is performed at a temperature in the range of 50° C. to 150° C.

* * * * *